(12) United States Patent
He

(10) Patent No.: US 11,948,656 B1
(45) Date of Patent: Apr. 2, 2024

(54) COUNTER MANAGEMENT FOR MEMORY SYSTEMS

(71) Applicant: Micron Technology, Inc., Boise, ID (US)

(72) Inventor: Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/934,137

(22) Filed: Sep. 21, 2022

(51) Int. Cl.
| | | |
|---|---|---|
| *G11C 29/52* | (2006.01) | |
| *G11C 11/4093* | (2006.01) | |
| *G11C 29/10* | (2006.01) | |
| *G11C 11/22* | (2006.01) | |
| *G11C 11/406* | (2006.01) | |

(52) U.S. Cl.
CPC .......... *G11C 29/52* (2013.01); *G11C 11/4093* (2013.01); *G11C 29/10* (2013.01); *G11C 11/221* (2013.01); *G11C 11/406* (2013.01)

(58) Field of Classification Search
CPC ... G11C 29/10; G11C 11/4093; G11C 11/221; G11C 29/52; G11C 29/406
See application file for complete search history.

(56) References Cited

U.S. PATENT DOCUMENTS

| | | | | |
|---|---|---|---|---|
| 9,685,240 | B1 * | 6/2017 | Park | G11C 11/40603 |
| 10,497,422 | B2 * | 12/2019 | Lee | G11C 11/40615 |
| 10,534,686 | B2 * | 1/2020 | Mazumder | G06F 11/3471 |
| 10,665,319 | B1 * | 5/2020 | Levin | G11C 29/38 |
| 10,950,288 | B2 * | 3/2021 | Nale | G06F 3/0619 |
| 11,361,811 | B2 * | 6/2022 | Devaux | G11C 11/4078 |
| 2015/0279441 | A1 * | 10/2015 | Greenberg | G11C 11/406 365/49.1 |
| 2016/0078911 | A1 * | 3/2016 | Fujiwara | G11C 29/028 365/189.2 |
| 2016/0202926 | A1 * | 7/2016 | Benedict | G06F 12/123 711/106 |
| 2016/0225433 | A1 * | 8/2016 | Bains | G11C 11/406 |
| 2017/0011792 | A1 * | 1/2017 | Oh | G11C 11/4076 |
| 2018/0158507 | A1 * | 6/2018 | Bang | G11C 11/40611 |
| 2018/0196616 | A1 * | 7/2018 | Cho | G06F 3/067 |
| 2019/0065079 | A1 * | 2/2019 | Lee | G06F 11/1666 |

(Continued)

OTHER PUBLICATIONS

B. Aichinger, "DDR memory errors caused by Row Hammer," 2015 IEEE High Performance Extreme Computing Conference (HPEC), Waltham, MA, USA, 2015.*

*Primary Examiner* — Steve N Nguyen
(74) *Attorney, Agent, or Firm* — Holland & Hart LLP

(57) ABSTRACT

Methods, systems, and devices for counter management for memory systems are described. A memory system may include circuitry configured to test localized counters of the memory system, where the circuitry may be configured to test a set of memory cells storing a value of the counter. During testing, the memory system may activate a row of memory cells a quantity of times, and the circuitry may increment a test counter associated with a subset of the set of memory cells for each activation to determine whether the subset is associated with an error. If a flag generated by the circuitry indicating a test count does not match an expected value, there may be an error associated with the subset. The circuitry may be operable to configure one or more multiplexers to refrain from using the subset to store the value of the counter based on the flag.

20 Claims, 8 Drawing Sheets

(56) References Cited

U.S. PATENT DOCUMENTS

| | | | |
|---|---|---|---|
| 2019/0066808 A1* | 2/2019 | Nale | G11C 11/406 |
| 2019/0347019 A1* | 11/2019 | Shin | G06F 3/0629 |
| 2021/0272620 A1* | 9/2021 | Barry | G11C 11/4087 |
| 2022/0246201 A1* | 8/2022 | Kim | G11C 7/1063 |
| 2023/0044186 A1* | 2/2023 | You | G11C 11/40622 |

* cited by examiner

COUNTER MANAGEMENT FOR MEMORY SYSTEMS

FIELD OF TECHNOLOGY

The following relates to one or more systems for memory, including counter management for memory systems.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
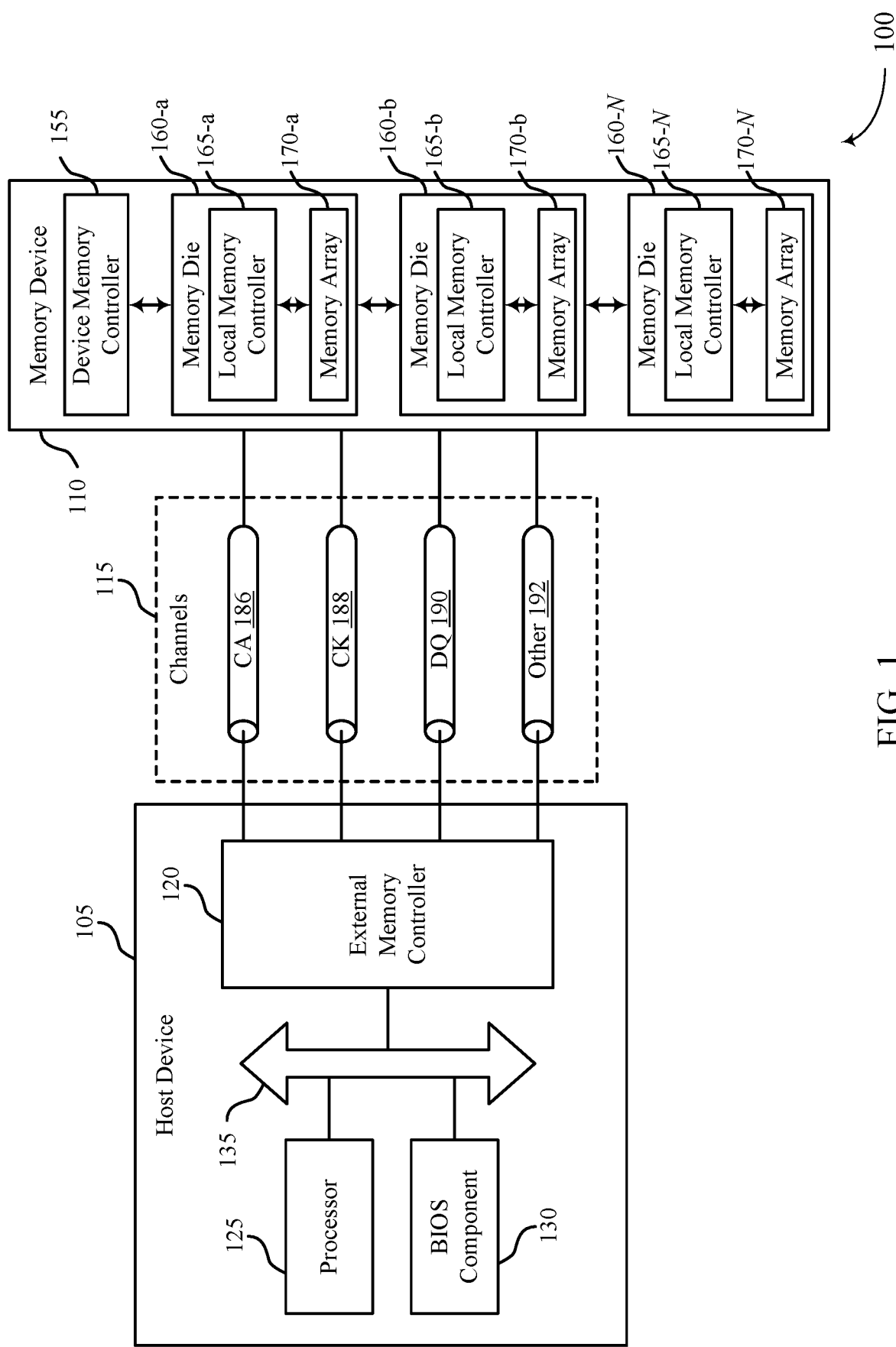
FIG. 1 illustrates an example of a system that supports counter management for memory systems in accordance with examples as disclosed herein.

In some cases, a memory system may implement a scheme (e.g., a deterministic scheme, a probabilistic scheme) to detect repeated activates of one or more rows of memory cells (e.g., row hammering). For example, the memory system may include one or more counters to track a quantity of times each row of memory cells is activated. If a value of a counter satisfies a threshold, the counter may output an indication of such and, in response, the memory system may repair (e.g., refresh) affected rows to mitigate the effects of row hammering. Such effects may include charge leakage or reduced data retention capabilities on rows adjacent to the frequently accessed (e.g., hammered) row of memory cells. However, the one or more counters may utilize access lines (e.g., local input/output (LIO) lines), increasing latency between operations (e.g., access operations) of the memory system. Moreover, the one or more counters may occupy a relatively large area of the memory system, thus reducing memory cell density.

To address such issues, a memory system may include localized counters, where respective values of the counters may be stored in the same row of memory cells as the data associated with the counter. Each counter may be maintained by circuitry integrated with (e.g., coupled to) the corresponding row of memory cells. Additionally, the circuitry may be configured to transmit signaling via a global input/output line (GIO) line of the memory system (e.g., as opposed to LIO lines). However, testing of the local counters may be limited due to the location and configuration of the local counters. Accordingly, methods to improve testing of the localized counters may be desirable to validate a row hammer mitigation scheme employed by the memory system.

In accordance with techniques as described herein, a memory system may include circuitry (e.g., a bank of multiplexers, a plurality of multiplexers) configured to maintain and test localized counters of the memory system, where a respective value of a counter is stored to set of memory cells of a row. For example, the circuitry may be configured to test the set of memory cells storing the value of the counter. During testing, the memory system may activate the row of memory cells a quantity of times, and the circuitry may increment a test counter associated with a subset of the set of memory cells for each activation to determine whether the subset is associated with an error. If a flag generated by the circuitry indicating a test count matches an expected value, the subset of memory cells may not be associated with an error. In other instances, if the flag does not match an expected value, the subset of memory cells may be associated with an error. The memory system may similarly test other subsets of the set of memory cells. The circuitry may be operable to configure one or more multiplexers of the circuitry to refrain from using a subset of the set of memory cells to store the value of the counter based on a value of a flag generated during testing. For example, if there are four subsets of memory cells that can store the counter, one of the subsets of memory cells (e.g., the subset with the error condition) may be avoided to ensure stored a better value of the counter. By testing the counter(s), the memory system may be able to validate the row hammer mitigation scheme, thus improving overall performance of the memory system.

Features of the disclosure are initially described in the context of systems and dies as described with reference to FIGS. 1 and 2. Features of the disclosure are described in the context of a memory dies, a block diagram, and a process flow as described with reference to FIGS. 3A through 6. These and other features of the disclosure are further illustrated by and described with reference to an apparatus diagram and a flowchart that relate to counter management for memory systems as described with reference to FIGS. 7 and 8.

FIG. 1 illustrates an example of a system 100 that supports counter management for memory systems in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, a memory device 110 may implement a scheme (e.g., a deterministic scheme, a probabilistic scheme) to detect repeated activates of one or more rows of memory cells (e.g., of a memory die 160). For example, the memory device 110 may include one or more counters to track a quantity of times each row of memory cells is activated. If a value of a counter satisfies a threshold, the counter may output an indication of such and, in response, the memory device 110 may repair (e.g., refresh) affected rows to mitigate the effects of row hammering. Such effects may include charge leakage or reduced data retention capabilities on rows adjacent to the frequently accessed (e.g., hammered) row of memory cells. In some cases, respective values of the counters may be stored in corresponding rows of memory cells of a memory die 160. Each counter may be maintained by circuitry integrated with (e.g., coupled to) the corresponding row of memory cells. Additionally, the circuitry may be configured to transmit signaling via a global input/output line (GIO) line of the memory die 160.

In accordance with techniques as described herein, a memory device 110 may include circuitry (e.g., a bank of multiplexers, a plurality of multiplexers) configured to maintain and test localized counters of the memory device 110, where a respective value of a counter is stored to set of memory cells of a row (e.g., of a memory die 160). For example, the circuitry may be configured to test the set of memory cells storing the value of the counter. During testing, the memory device 110 may activate the row of memory cells a quantity of times, and the circuitry may increment a test counter associated with a subset of the set of memory cells for each activation to determine whether the subset is associated with an error. If a flag generated by the circuitry indicating a test count matches an expected value, the subset of memory cells may not be associated with an error. If the flag does not match an expected value, the subset of memory cells may be associated with an error. The memory device 110 may similarly test other subsets of the set of memory cells. The circuitry may be operable to configure one or more multiplexers of the circuitry to refrain from using a subset of the set of memory cells to store the value of the counter based on a value of a flag generated during testing. By testing the counter(s), the memory device 110 may be able to validate the row hammer mitigation scheme, thus improving overall performance of the memory device 110.

Figure 2:
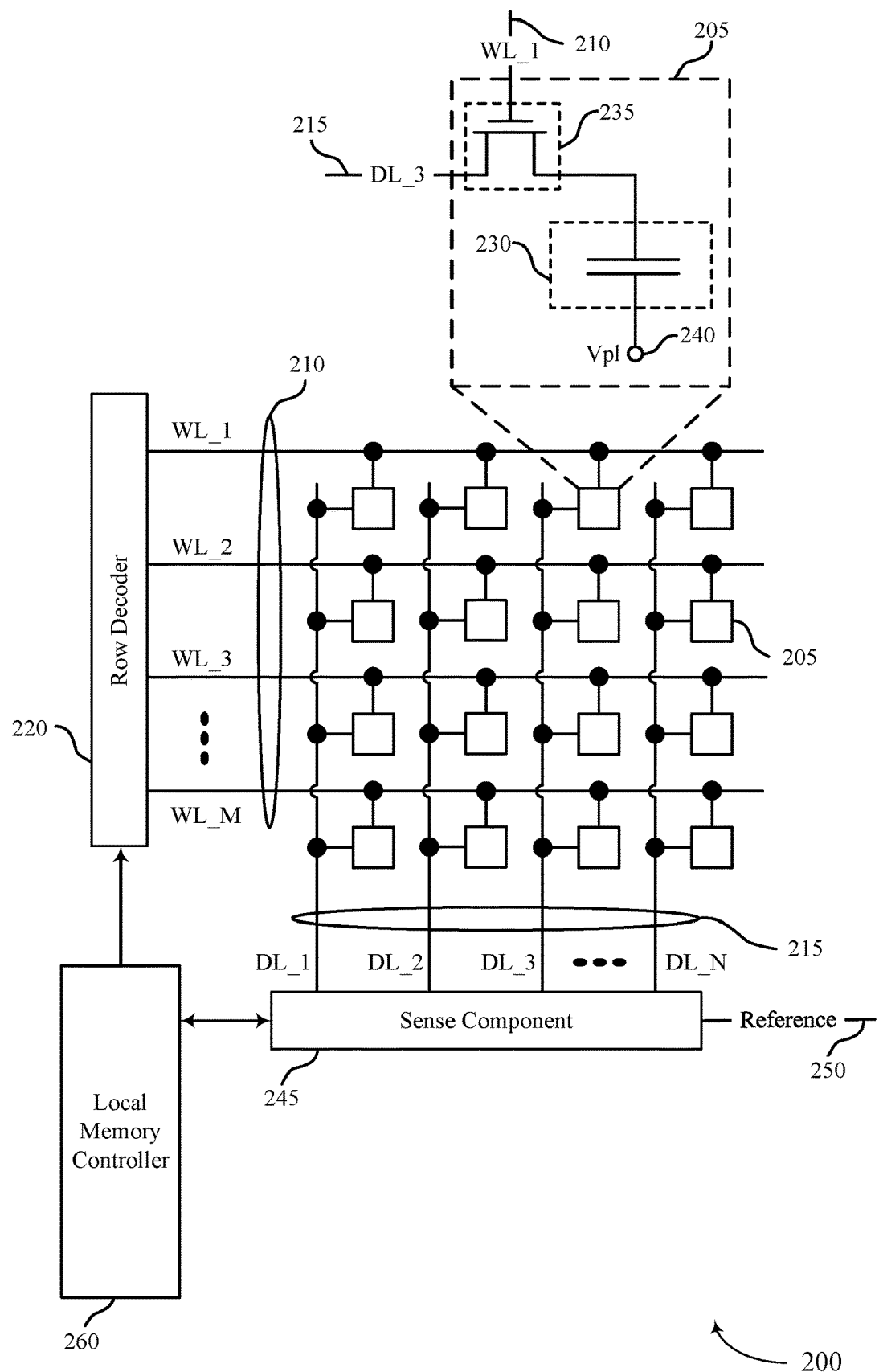
FIG. 2 illustrates an example of a memory die that supports counter management for memory systems in accordance with examples as disclosed herein.

FIG. 2 illustrates an example of a memory die 200 that supports counter management for memory systems in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a local counter (not shown) as described with reference to FIG. 3A, or any combination thereof. For example, a row decoder 220 may receive a row address from the local memory controller 260 and activate a word line 210 based on the received row address. A local counter may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to local counter), and may indicate the detected logic state to another component of a memory device (e.g., a memory device 110) that includes the memory die 200.

The local memory controller 260 may control the accessing of memory cells 205 through the various components (e.g., row decoder 220, local counter, sense component 245). The local memory controller 260 may be an example of the local memory controller 165 described with reference to FIG. 1. In some examples, one or more of the row decoder 220, local counter, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In some cases, a memory die 200 may implement a scheme (e.g., a deterministic scheme, a probabilistic scheme) to detect repeated activates of one or more rows of memory cells 205. For example, the memory die 200 may include one or more counters to track a quantity of times each row of memory cells 205 is activated. If a value of a counter satisfies a threshold, the counter may output an indication of such and, in response, the memory die 200 may repair (e.g., refresh) affected rows to mitigate the effects of row hammering. Such effects may include charge leakage or reduced data retention capabilities on rows adjacent to the frequently accessed (e.g., hammered) row of memory cells 205. In some cases, respective values of the counters may be stored in corresponding rows of memory cells 205. Each counter may be maintained by circuitry integrated with (e.g., coupled to) the corresponding row of memory cells 205. Additionally, the circuitry may be configured to transmit signaling via a global input/output line (GIO) line of the memory die 200.

In accordance with techniques as described herein, a memory die 200 may include circuitry (e.g., a bank of multiplexers, a plurality of multiplexers) configured to maintain and test localized counters of the memory die 200, where a respective value of a counter is stored to set of memory cells 205 of a row. For example, the circuitry may be configured to test the set of memory cells 205 storing the value of the counter. During testing, the memory die 200 may activate the row of memory cells 205 a quantity of times, and the circuitry may increment a test counter associated with a subset of the set of memory cells 205 for each activation to determine whether the subset is associated with an error. If a flag generated by the circuitry indicating a test count matches an expected value, the subset of memory cells may not be associated with an error. If the flag does not match an expected value, the subset of memory cells may be associated with an error. The memory die 200 may similarly test other subsets of the set of memory cells. The circuitry may be operable to configure one or more multiplexers of the circuitry to refrain from using a subset of the set of memory cells 205 to store the value of the counter based on a value of a flag generated during testing. By testing the counter(s), the memory die 200 may be able to validate the row hammer mitigation scheme, thus improving overall performance of the memory die 200.

Figure 3A:
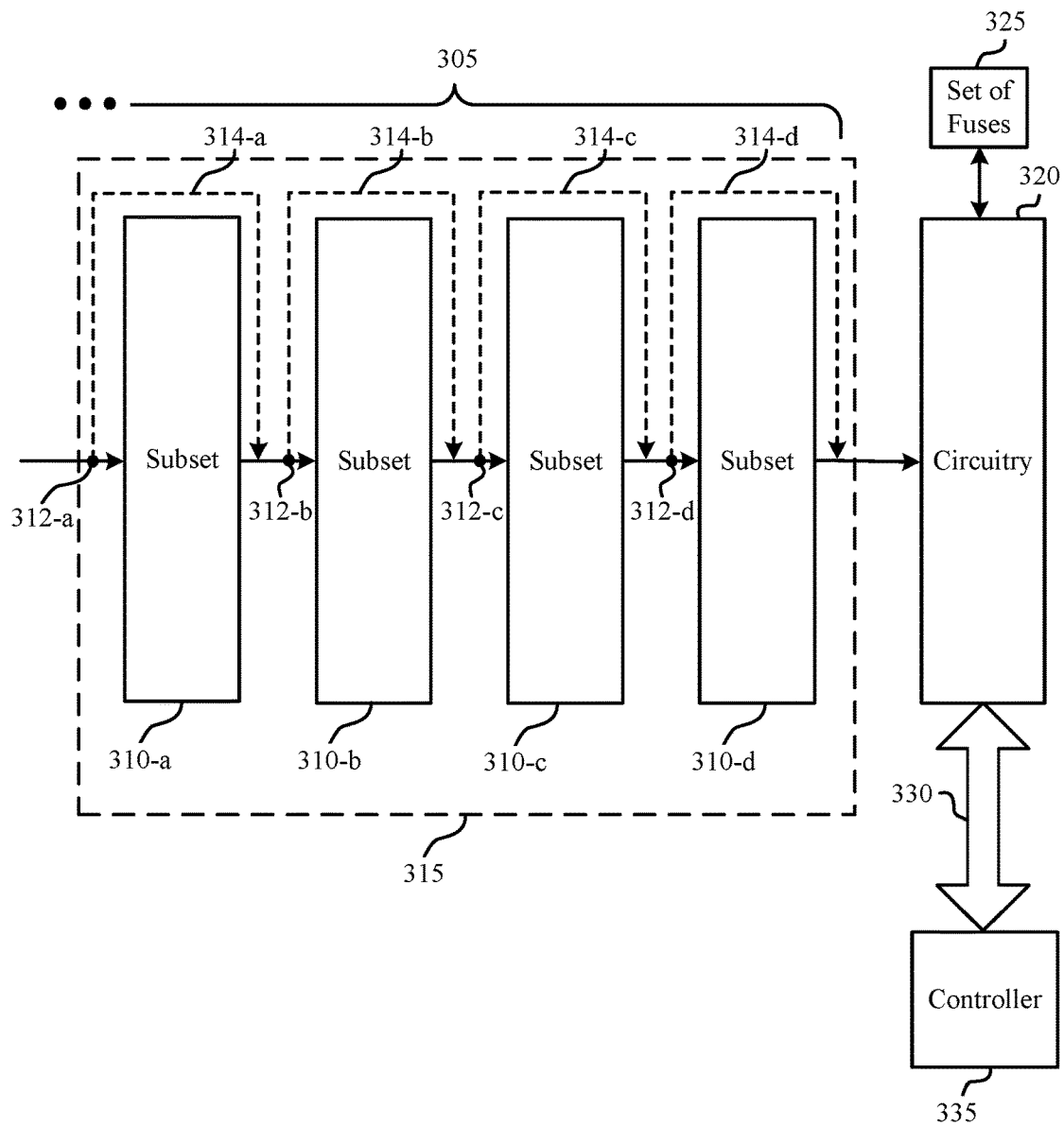
FIG. 3A illustrates an example of a memory die that supports counter management for memory systems in accordance with examples as disclosed herein.

FIG. 3A illustrates an example of a memory die 300-*a* that supports counter management for memory systems in accordance with examples as disclosed herein. The memory die 300-*a* may be an example of the memory die 160 or the memory die 200 as described with reference to FIGS. 1 and 2, respectively. In such examples, the memory die 300-*a* may include a row of memory cells 305 and circuitry 320 coupled to the row of memory cells 305. The circuitry 320 may be configured to maintain one or more counters that track a quantity of activates to the row of memory cells 305, where a set of memory cells 315 of the row of memory cells 305 may store one or more counter bits (e.g., a set of counter bits) representing the value of the counter. In some examples, the circuitry 320 may test the counter (e.g., test the set of memory cells 315) to validate a row hammer mitigation scheme (e.g., a deterministic scheme) implemented by the memory die 300-*a*.

In some examples, the memory die 300-*a* may include a controller 335, where the controller 335 may be coupled to the circuitry 320 and to the row of memory cells 305. The controller 335 may perform various operations associated with the memory die 300-*a*. For example, the controller 335 may access (e.g., read from, write to) the row of memory cells 305, refresh the row of memory cells 305, and may facilitate (e.g., initiate, evaluate) test operations of the counter, among other operations. In such cases, accessing the row of memory cells 305 may include activating the row of memory cells 305.

In some examples, the row of memory cells 305 may be configured to store both data (e.g., received from a host device) and the set of counter bits (e.g., set of 16 counter bits). In such examples, the set of memory cells 315 may include four subsets 310, where each of the subsets may include a portion of the memory cells of the set of memory cells 315 (e.g., a fourth of the set of memory cells, 4 memory cells). As such, a subset 310 may store a portion of the set of counter bits (e.g., 4 bits). One of the subsets 310 may be redundant to the value of the counter represented by the set of counter bits stored to the set of memory cells 315. That is, a portion of the set of counter bits (e.g., 12 bits) may represent the value of the counter, and remaining counter bits (e.g., stored to a redundant subset 310) may be for redundancy purposes. By including a redundant subset 310, the memory die 300-*a* may be able to account for defects associated with the counter (e.g., associated with the set of memory cells 315, for example) and, as such, may maintain an accurate count of activations of the row of memory cells 305.

The circuitry 320 may include a plurality of multiplexers (e.g., a bank of multiplexers) configured to perform various operations associated with the counter. In some cases, the circuitry 320 may be configured to increment the value of the counter. For example, the circuitry 320 may increment the value of the counter by adjusting (e.g., updating) one or more bits of the set of counter bits in accordance with (e.g., in response to) each activation of the row of memory cells 305 (e.g., by the controller 335). The circuitry 320 may adjust the bits based on a path (e.g., a linked path) between one or more of the plurality of multiplexers. Subsequently, the circuitry 320 may determine if the value of the counter satisfies a threshold value, where the threshold value may represent a quantity of activations the row of memory cells 305 may support. If the circuitry 320 determines that the value of the counter satisfies the threshold value, the circuitry 320 may transmit a flag (e.g., indicating an overflow condition) to the controller 335 via a GIO line 330. Additionally or alternatively, the circuitry 320 may decrement the value of the counter in response to a refresh operation performed on one or more rows of memory cells adjacent to the row of memory cells 305 (not shown).

In some examples, the circuitry 320 may be coupled to a set of fuses 325, where the set of fuses 325 includes fuses associated with a respective subset 310. In such examples, the circuitry 320 may be configured to increment the value of the counter in accordance with the set of fuses 325. A redundant subset 310 may be associated with an activated (e.g., blown) fuse of the set of fuses 325. The circuitry 320 may refrain from adjusting counter bits stored to the redundant subset 310 while incrementing the value of the counter (e.g., in association with an activation) based on a blown fuse, where the relative location of a blown fuse may set the path (e.g., the linked path) between the one or more of the plurality of multiplexers for incrementing the value of the counter using the three remaining subsets of memory cells of the row of memory cells 305.

In some examples, the controller 335, may initiate a test of the counter associated with the row of memory cells 305. For example, the controller 335 may initiate a test on the set of memory cells 315 (e.g., storing counter bits representing the value of the counter) in response to the flag indicating an overflow condition. Additionally or alternatively, the controller 335 may initiate the test based on a condition of the memory die 300-*a* (e.g., as part of a boot procedure, for example) or based on a duration since a previous testing operation. In such examples, the controller 335 may test each of the subsets 310 (e.g., consecutively), where the controller 335 may transmit to the circuitry 320, a test mode signal (e.g., a first test mode signal, a second test mode signal, for example) associated with a respect subset 310. In some cases, in response to receiving the test mode signal from the controller 335 and in conjunction with one or more operations (e.g., activations) performed by the controller 335, the circuitry 320 may test respective subsets 310 to determine whether memory cells of the subsets 310 are functioning properly and, by extension, if the counter is valid.

In some examples, the circuitry 320 may receive a test mode signal from the controller 335 to initiate a testing operation (e.g., a first test operation, a second testing operation, for example) on a subset 310 of the set of counter bits. For example, the circuitry 320 may receive a first test mode signal associated with the subset 310-*a*, and, in accordance with the first test mode signal, the circuitry 320 may be configured to perform a first testing operation, where the circuitry 320 may select a linked path between one or more of the plurality of multiplexers to test the subset 310-*a*. In such examples, the first test mode signal may be transmitted along respective control lines of the plurality of multiplexers to configure the plurality of multiplexers to select specific input lines to each of the plurality of multiplexers, where input line selection may configure the linked path.

To test the subset 310-*a*, the circuitry 320 may increment a first test counter, where the value of the first test counter is represented by one or more counter bits associated with (e.g., stored to) the first subset 310-*a*, and may determine whether the counter bits associated with first subset 310-*a* (e.g., a most significant bit associated with the subset 310-*a*) match an expected value following the incrementation.

In such cases, the controller 335 may activate the row of memory cells 305 a first quantity of times, and the circuitry 320 may adjust one or more counter bits associated with the subset 310-*a* in response to each of the activates to count the first quantity of activates (e.g., 16 activates). For example, the circuitry 320 may track the quantity of activates using a linked path between multiplexers (e.g., between respective multiplexer inputs), where a bit of the counter is output from a first multiplexer to a second multiplexer in accordance with the first quantity of activates (e.g., a portion of the first quantity of activates). The bit may be input to the first multiplexer along a first input line (e.g., of a plurality of input lines to the first multiplexer), and may represent a least significant bit of the test counter (e.g., associated with the subset 310-*a*). The bit may be output from the first multiplexer to a second multiplexer and may represent a next most significant bit. That is, a relative position of the bit along the linked path (e.g., with respect to the multiplexers) may indicate a significance of the bit.

In some cases, the circuitry 320 may generate a flag (e.g., first flag) based on activating the row of memory cells 315 the first quantity of times, where the first flag indicates an error condition associated with the subset 310-*a* (e.g., an error associated with incrementing a test counter including bits associated with the subset 310-*a*). In some examples, following the first quantity of activates, the counter bits of the subset 310-*a* may match an expected binary value (e.g., '1000'), and the first flag may include the most significant bit from the subset 310-*a* (e.g., '1'). The circuitry 320 may transmit the first flag to the controller 335 via the GIO line 330. If the value of the first flag matches the expected value (e.g., '1'), the first test counter associated with the subset 310-*a* may be incrementing correctly. If the value of the first flag does not match the expected value (e.g., '0'), the first test counter associated with the subset 310-*a* may not be incrementing correctly and there may be an error associated with the subset 310-*a*.

In conjunction with the controller 335, the circuitry 320 may similarly test subsets 310-*b* through 310-*d*. For example, the controller 335 may transmit test mode signaling, the circuitry 320 may select a corresponding linked path through one or more of the plurality of multiplexers, the controller 335 may activate the row of memory cells 305 a set quantity of times (e.g., 16 times), and the circuitry 320 may generate and transmit a flag associated with the subset 310. In some examples, the controller 335 may refrain from testing each of the subsets 310 in which, for instance, the controller 335 may refrain from transmitting additional test mode signals (e.g., a third test mode signal, a fourth test mode signal, for example) if errors are found associated with two of the subsets 310 (e.g., based on two or more flags) (e.g., associated with one or more memory cells of the subsets 310).

If the controller 335 determines an error condition associated with one of the subsets 310, the controller 335 or the circuitry 320 may activate (e.g., blow) a fuse of the set of fuses 325 associated with the subset 310 including the error. For example, either the controller 335 or the circuitry 320 may blow the fuse by transmitting a current (e.g., above a threshold current) across the fuse. By blowing the fuse, the subset 310 including the error may be made redundant to the value of the counter. For example, blowing a fuse may configure (e.g., set) a linked path between one or more multiplexers of the plurality of multiplexers (e.g., based on a relative position of the blown fuse in the set of fuses 325).

For example, if the first subset 310-*a* has an error condition, the one or more multiplexers may be configured to configure a linked path between the second subset 310-*b*, the third subset 310-*c*, and the fourth subset 310-*d* to store the value of the counter. That is, by blowing one or more fuses, at the node 312-*a*, the linked path 314-*a* may be selected to bypass the second subset 310-*b*. Similarly, if the second subset 310-*b* has an error condition, at the node 312-*b*, the linked path 314-*b* may be selected to bypass the first subset 310-*b*. Additionally or alternatively, if the third subset 310-*c* has an error condition, at the node 312-*c*, the linked path 314-*c* may be selected to bypass the third subset 310-*c*, and if the fourth subset 310-*b* has an error condition, at the node 312-*d*, the linked path 314-*d* may be selected to bypass the fourth subset 310-*d*. In other instances, each node 312 may include one or more switches to select a linked path 314 in the event of an error condition.

As such, the circuitry 320 may bypass the first subset 310-*a* during incrementation based on the blown fuse, where the circuitry 320 may refrain from reading counter bits included in the corresponding subset 310 that is associated with the error condition. By making a subset 310 redundant to the value of the counter, the memory die 300-*a* may be able to account for errors associated with the set of memory cells 315.

If the controller 335 determines an error associated with two or more of the subsets 310, the controller 335 may transmit a command to discard the row of memory cells 305 (e.g., a memory bank including the row of memory cells 305, the memory die 300-*a*). For example, the controller 335 may transmit the command and the row of memory cells 305 may be discarded. In such examples, the row of memory cells may be discarded because a counter associated with the row of memory cells 305 may have been invalidated, and the row of memory cells 305 may be at increased risk for row-hammering.

If the controller 335 determines that there are no errors in the subsets 310, the controller 335 may refrain from transmitting either the command to blow a fuse or the command to discard the die. In such cases, the current configuration of the counter may be maintained, where the set of memory cells 315 may follow a same configuration as prior to testing. The circuitry 320 may include a same linked path (e.g., in accordance with the set of fuses 325) as prior to testing. As such, the same subset 310 may remain redundant as prior to testing, and the value of the counter may be represented by the three other subsets 310 during general operation.

By validating the counter (e.g., the set of memory cells 315), the memory die 300-*a* may ensure that the row hammer mitigation scheme (e.g., a deterministic scheme) associated with the counter is valid. Accordingly, the memory die 300-*a* may mitigate the likelihood of row hammering, and such testing may improve the overall performance of the memory die 300-a.

Figure 3B:
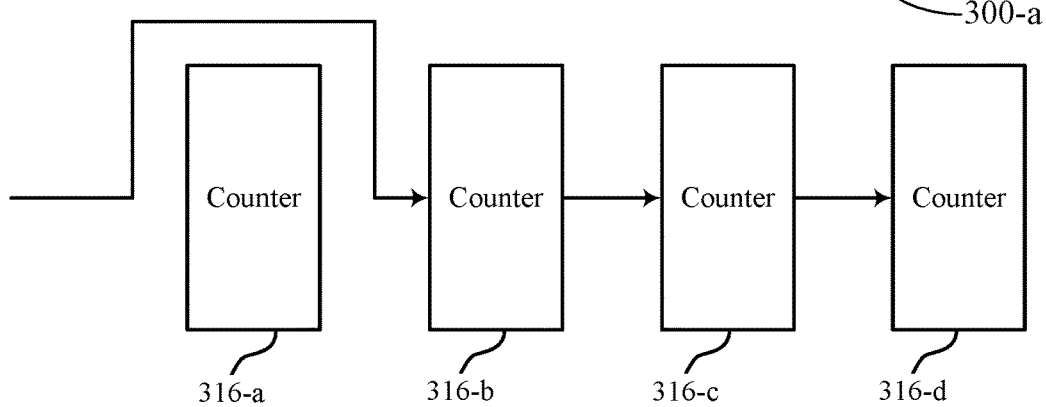
FIG. 3B illustrates an example of a block diagram that supports counter management for memory systems in accordance with examples as disclosed herein.

FIG. 3B illustrates an example of a block diagram 300-b of a counter chain that supports counter management for memory systems in accordance with examples as disclosed herein. The block diagram 300-b may illustrate one on more counters 316. In some examples, associated circuitry (e.g., the circuitry 320 described with reference to FIG. 3A) may test the counters 316 (e.g., test the set of memory cells associated with a counter) to validate a row hammer mitigation scheme (e.g., a deterministic scheme) implemented by an associated memory die.

As described herein with reference to FIG. 3A, the circuitry 320 may be configured to maintain one or more counters that track a quantity of activates to the row of memory cells 305, where a set of memory cells 315 of the row of memory cells 305 may store one or more counter bits (e.g., a set of counter bits) representing the value of the counter. The set of memory cells 315 may include four subsets 310, where each of the subsets may include a portion of the memory cells of the set of memory cells 315 (e.g., a fourth of the set of memory cells, 4 memory cells). As such, a subset 310 may store a portion of the set of counter bits (e.g., 4 bits) and one of the subsets 310 may be redundant to the value of the counter represented by the set of counter bits stored to the set of memory cells 315. Accordingly, one of the four counters may be skipped for redundancy purposes (e.g., when an error condition is not detected) or when a flag is output from the circuitry 320 (e.g., upon the occurrence of an error condition of a counter).

Any of the counters 316 shown in FIG. 3B may be bypassed (e.g., skipped) by blowing one or more fuses to configure a linked path between a subset of the counters 316. For example, if the first counter 316-a is associated with an error condition, one or more multiplexers (e.g., one or more multiplexers as describe with reference to FIG. 4) may be configured to configure a linked path between the second counter 316-b, the third counter 316-c, and the fourth counter 316-d. That is, by blowing one or more fuses, the first counter 316-a may be bypassed. Similarly, if the second counter 316-b has an error condition (not shown), the linked path may be set to bypass the second counter 316-b. Additionally or alternatively, if the third counter 316-c or the fourth counter 316-d are associated with an error condition (not shown), the linked path may be set to bypass the respective counter 316 associated with an error condition. Accordingly, a use of the counters 316 may mitigate the likelihood of row hammering, and such testing may improve the overall performance of an associated memory die.

Figure 4:
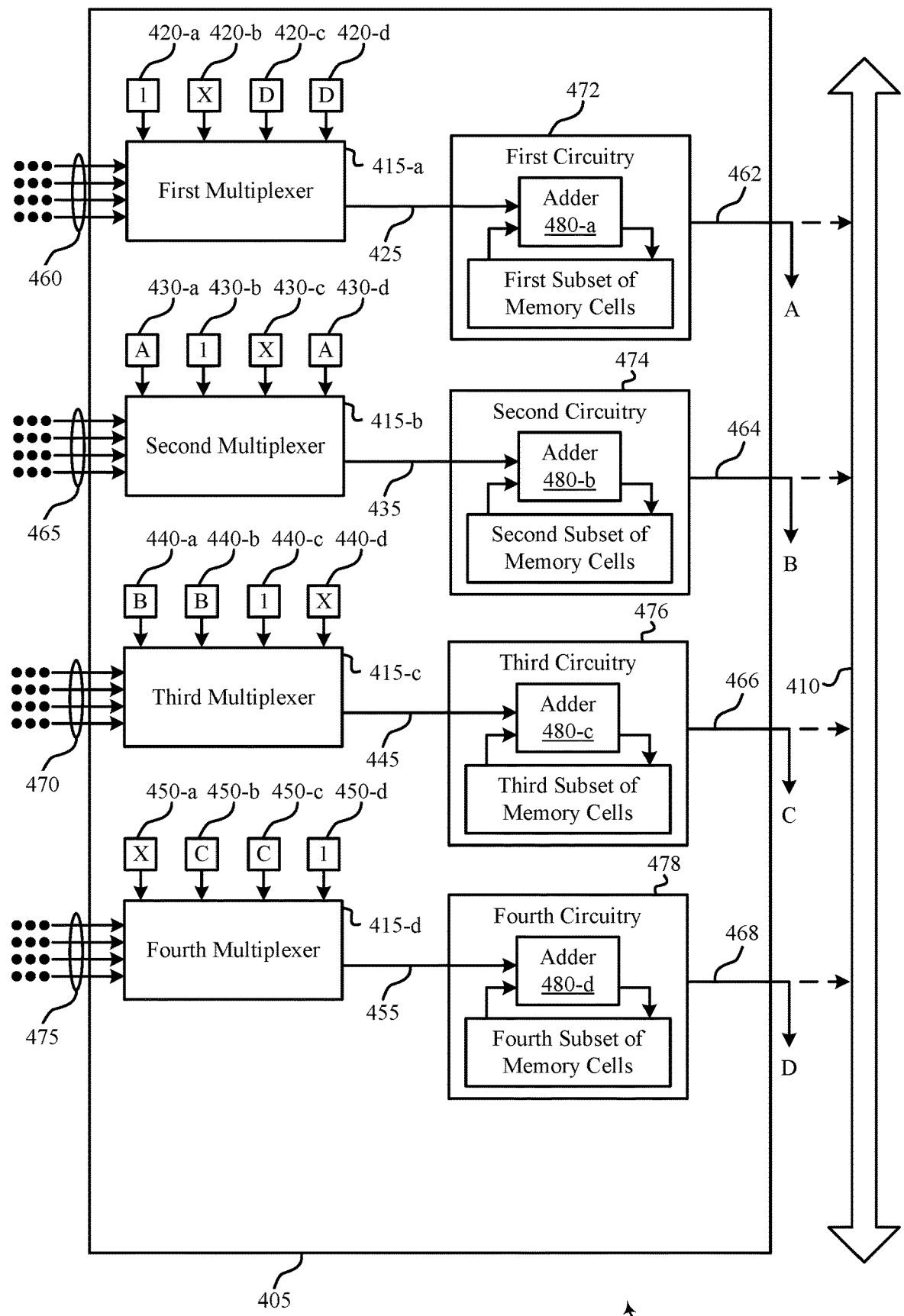
FIG. 4 illustrates an example of a circuit diagram that supports counter management for memory systems in accordance with examples as disclosed herein.

FIG. 4 illustrates an example of a circuit diagram 400 that supports counter management for memory systems in accordance with examples as disclosed herein. In some examples, the circuit diagram 400 may illustrate circuitry 405, which may be an example of the circuitry 320 described with reference to FIG. 3A. The circuitry 405 may include one or more multiplexers 415. Each multiplexer 415 may include one or more input lines (e.g., input lines 420, input lines 430, input lines 440, input lines 450) and one or more control lines (e.g., control lines 460, control lines 465, control lines 470, control lines 475). Additionally or alternatively, the circuitry 405 may be coupled with a GIO line 410, which may be used to transmit a flag to a controller (not shown). As described herein, the circuitry 405 may test a counter to validate a row hammer mitigation scheme (e.g., a deterministic scheme) implemented by a memory die.

In some examples, the circuitry 405 may include at least a first multiplexer 415-a, a second multiplexer 415-b, a third multiplexer 415-c, and a fourth multiplexer 415-d. Each multiplexer may include a respective control line (e.g., the first multiplexer 415-a may include a control line 460, the second multiplexer 415-b may include a control line 465, etc.). Moreover, each multiplexer may include one or more input lines. For example, the first multiplexer 415-a may include input lines 420-a through 420-d, the second multiplexer 415-b may include input lines 430-a through 430-d, the third multiplexer 415-c may include input lines 440-a through 440-d, and the fourth multiplexer 415-d may include input lines 450-a through 450-d.

Additionally or alternatively, each multiplexer 415 may include a respective output. For example, the first multiplexer 415-a may include output 425, the second multiplexer 415-b may include output 435, the third multiplexer 415-c may include output 445, and the fourth multiplexer 415-d may include output 455. As described herein, the circuitry 405 may be coupled with a set of fuses (e.g., a set of fuses 325 as described with reference to FIG. 3A). In some examples, the relative location of a blown fuse may set the path (e.g., the linked path) between the one or more of the plurality of multiplexers 415. For example, based on a location of a blown fuse, the output 425 may be provided to the input line 430-a, the output 435 may be provided to the input line 440-a, and so on.

In some examples, the circuitry 405 may receive a test mode signal from a controller to initiate a testing operation. For example, a first test mode signal (e.g., TmFzMode <0>) may be provided to the control line of each multiplexer 415. In some examples, the control lines 460 may include four separate conductive lines and the first test mode signal may be an example of a four-bit signal, one bit communicated over one line of the control lines. The control lines 465, 470, and 475 may be configured similarly as the control lines 460. In some instances, the fourth multiplexer 415-d may be bypassed based on the first test mode signal being applied. However, in other instances, any one of the multiplexers 415 may be bypassed according to the fuse (or the set of fuses) that are blown to set a linked path. As described herein, the first test mode signal may configure the plurality of multiplexers 415 to select specific input lines.

In some instances, the first test mode signal may result in the incrementation of a first test counter, where the value of the first test counter is represented by one or more counter bits associated with (e.g., stored to) a first subset of memory cells. In such cases, the row of memory cells may be activated a first quantity of times, and the circuitry 405 may adjust one or more counter bits associated with the subset in response to each of the activates. In some examples, a first bit of the counter bits (e.g., a least significant bit) may be input to the input line 420-a of the first multiplexer 415-a. The bit may be output from the first multiplexer 415-a (e.g., via the output 425) to the first circuitry 472 and may be provided to the input line 430-a of the second multiplexer 415-b. The bit provided to the second multiplexer 415-b may represent a next-most-significant bit of the counter bits.

Additionally or alternatively, a bit may be output from the second multiplexer 415-b (e.g., via the output 435) to the second circuitry 474 and may be provided to the input line 440-a of the third multiplexer 415-c. The bit provided to the third multiplexer 415-c may represent a next-most-significant bit of the counter bits. In some instances, due to the test mode signal (e.g., due to the fourth multiplexer 415-d being bypassed due to the first test mode signal), the third multiplexer 415-c may output a bit to the third circuitry 476 and then to the GIO line 410 (e.g., via the output 466). In some instances, the bit may represent a most-significant bit of the counter bits.

In some cases, bit output from the third circuitry 476 may include or be associated with a flag (e.g., first flag). The flag, which may be generated based on activating the row of memory cells a first quantity of times, may indicate an error condition associated with a subset of memory cells. In some cases, the flag may be an indication of an overflow condition of the third subset of memory cells in the third circuitry 476. When such an overflow condition occurs it may indicate that the quantity of times the row was activated exceeded the quantity of values that are trackable by the counter (e.g., the first subset of memory cells, the second subset of memory cells, and the third subset of memory cells). In some cases, following the first quantity of activates, the counter bits of the subset may match an expected binary value (e.g., '1000'), and the first flag may include the most significant bit from the subset (e.g., '1'). If the value of the first flag matches the expected value (e.g., '1'), the first test counter associated with the subset may be incrementing correctly. If the value of the first flag does not match the expected value (e.g., '0'), the first test counter associated with the subset may not be incrementing correctly and there may be an error associated with the sub set.

The circuitry 405 may similarly test other subsets of memory cells (e.g., subsets 310-b through 310-d as described with reference to FIG. 3A). During such testing, the multiplexers 415 may receive corresponding test mode signaling via the respective control lines. For example, to test a second subset of memory cells, a second test mode signal (e.g., TmFzMode <1>) may be provided to the control line of each multiplexer 415. As described herein, each test mode signal may result in a respective multiplexer 415 and subset of memory cells being bypassed. In other instances, if errors are found associated with two of the subsets (e.g., if two or more flags are output via the GIO line 410), the testing operation may end and an associated row or bank of memory cells (or an associated memory die) may be discarded.

An example of how the plurality of multiplexers can route signals between the subsets of memory cells is described. The example row of memory cells may include four subsets of memory cells (e.g., a first subset of memory cells associated with the first circuitry 472, a second subset of memory cells associated with the second circuitry 474, a third subset of memory cells associated with the third circuitry 476, and a fourth subset of memory cells associated with the fourth circuitry 478) and a multiplexer associated with each subset of memory cells. The testing procedure may be used to determine if any of the subsets are associated with an error condition. The value of the counter may be designed to be stored by three subsets of memory cells. Thus, one of the subsets of the memory cells may be redundant. After a testing procedure a control signal for the plurality of multiplexers may be configured.

The inputs of the multiplexers may be coupled with various outputs of the different subsets of memory cells in such a way that one of the subsets of memory cells may cease to be used to store the value of the counter. In a first example, if the fourth subset is associated with an error condition, the multiplexers may be configured to create a linked path between the first subset, the second subset, and the third subset of memory cells to store the value of the counter. In such an example, the first subset may store the least significant bits of the value of the counter, the second subset may store the middle set of bits (e.g., the next-most-significant bits) of the value of the counter, and the third subset may store the most significant bits of the value of the counter. The flag may be output to the GIO line 410 in response to an overflow condition occurring at the third subset (which represents the most significant bits).

In a second example, if the first subset is associated with an error condition, the multiplexers may be configured to create a linked path between the second subset, the third subset, and the fourth subset to store the value of the counter. In such an example, the second subset may store the least significant bits of the value of the counter, the third subset may store the middle set of bits (e.g., the next-most-significant bits) of the value of the counter, and the fourth subset may store the most significant bits of the value of the counter. The flag may be output to the GIO line 410 in response to an overflow condition occurring at the fourth subset (which represents the most significant bits).

In a third example, if the second subset is associated with an error condition, the multiplexers may be configured to create a linked path between the third subset, the fourth subset, and the first subset to store the value of the counter. In such an example, the third subset may store the least significant bits of the value of the counter, the fourth subset may store the middle set of bits (e.g., the next-most-significant bits) of the value of the counter, and the first subset may store the most significant bits of the value of the counter. The flag may be output to the GIO line 410 in response to an overflow condition occurring at the first subset (which represents the most significant bits).

In a fourth example, if the third subset is associated with an error condition, the multiplexers may be configured to create a linked path between the fourth subset, the first subset, and the second subset to store the value of the counter. In such an example, the fourth subset may store the least significant bits of the value of the counter, the first subset may store the middle set of bits (e.g., the next-most-significant bits) of the value of the counter, and the second subset may store the most significant bits of the value of the counter. The flag may be output to the GIO line 410 in response to an overflow condition occurring at the second subset (which represents the most significant bits).

As described herein, each multiplexer may be coupled with respective circuitry via a line (e.g., an output line). For example, the first multiplexer 415-a may be coupled with first circuitry 472 via an output line 425, the second multiplexer 415-b may be coupled with second circuitry 474 via an output line 435, the third multiplexer 415-c may be coupled with third circuitry 476 via an output line 445, and the fourth multiplexer 415-d may be coupled with fourth circuitry 478 via an output line 455.

In some examples, the respective circuitry may be integrated with (e.g., coupled to) to a memory bank (e.g., to one or more subsets of memory cells and may be selectively coupled to the GIO line 410. The circuitry may be configured to maintain (e.g., increment) the value of a counter for each respective subset of memory cells. In some examples, the respective circuitry may include one or more adders (e.g., one or more adders 480, such as adder 480-a, adder 480-b, adder 480-c, and adder 480-d), where the adders may each increment respective values of the counter for each of the subsets of memory cells. In such examples, an adder may be configured to increment the value of a counter in response to an activation of the corresponding row, where the adder may adjust (e.g., update) the value of one or more bits of the set of bits representing the value of the counter.

In some examples, each circuitry may be configured to output one or more bits (e.g., a flag) to the GIO line 410 or to a multiplexer. For example, the line 462 (e.g., the output line 462) may output one or more bits to the GIO line 410 or to the second multiplexer 415-*b*. The signal output via the line 462 may be a signal in response to the first subset of memory cells experiencing an overflow condition (e.g., if the first subset of memory cells includes four memory cells, an overflow condition may occur when the first subset of memory cells try to store a value that uses more than four bits to be represented, such as storing the integer value 16). The line 464 (e.g., the output line 464) may output one or more bits to the GIO line 410 or to the third multiplexer 415-*c*. The signal output via the line 464 may be a signal in response to the second subset of memory cells experiencing an overflow condition. The line 466 (e.g., the output line 466) may output one or more bits to the GIO line 410 or to the fourth multiplexer 415-*d*. The signal output via the line 466 may be a signal in response to the third subset of memory cells experiencing an overflow condition. The line 468 (e.g., the output line 468) may output one or more bits to the GIO line 410 or to the first multiplexer 415-*a*. The signal output via the line 468 may be a signal in response to the fourth subset of memory cells experiencing an overflow condition.

As described herein, in a first example, if the fourth subset of memory cells is associated with an error condition, the multiplexers may be configured to create a linked path between the first subset, the second subset, and the third subset of memory cells to store the value of the counter. In such an example, the first subset may store the least significant bits of the value of the counter, the second subset may store the middle set of bits (e.g., the next-most-significant bits) of the value of the counter, and the third subset may store the most significant bits of the value of the counter. The value stored by the second subset may be incremented in response to the first subset experiencing an overflow condition. The value stored by the third subset may be incremented in response to the second subset experience an overflow condition. The flag may be output to the GIO line 410 in response to an overflow condition occurring at the third subset (which represents the most significant bits). Any of subset of memory cells may be avoided using the multiplexers and the principles described herein may be used with different arrangements of subsets of memory cells.

By validating the counter (e.g., the set of memory cells), an associated memory die may ensure that the row hammer mitigation scheme (e.g., a deterministic scheme) associated with the counter is valid. Accordingly, the memory die may mitigate the likelihood of row hammering, and such testing may improve the overall performance of the memory die.

Figure 5:
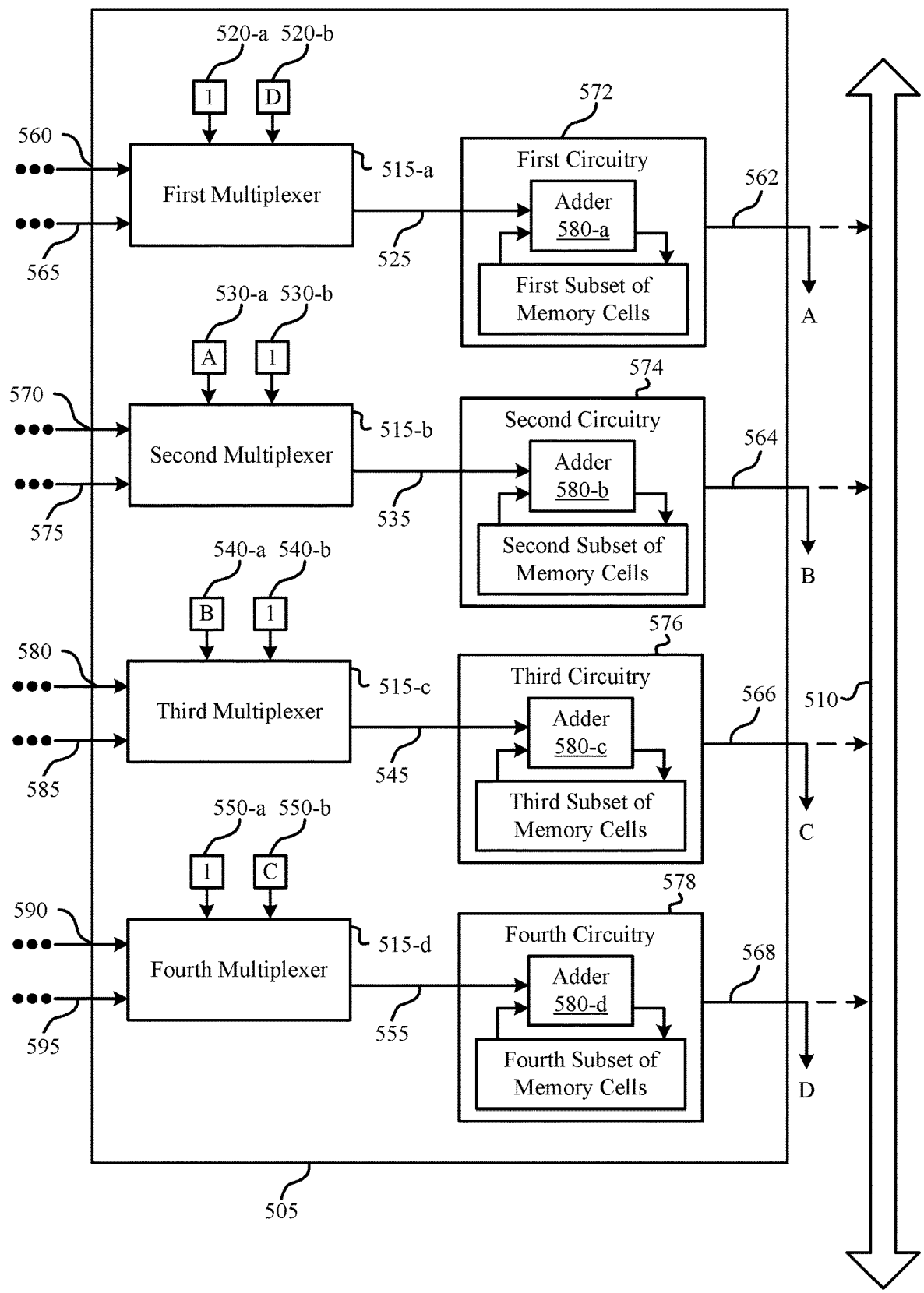
FIG. 5 illustrates an example of a circuit diagram that supports counter management for memory systems in accordance with examples as disclosed herein.

FIG. 5 illustrates an example of a circuit diagram 500 that supports counter management for memory systems in accordance with examples as disclosed herein. In some examples, the circuit diagram 500 may illustrate circuitry 505, which may be an example of the circuitry 320 described with reference to FIG. 3A. The circuitry 505 may include one or more multiplexers 515. Each multiplexer 515 may include one or more input lines (e.g., input lines 520, input lines 530, input lines 540, input lines 550) and one or more control lines (e.g., control line 560, control line 565, control line 570, control line 575, control line 580, control line 585, control line 590, and control line 595). Additionally or alternatively, the circuitry 505 may be coupled with a GIO line 510, which may be used to transmit a flag to a controller (not shown). As described herein, the circuitry 505 may test a counter to validate a row hammer mitigation scheme (e.g., a deterministic scheme) implemented by a memory die.

In some examples, the circuitry 505 may include at least a first multiplexer 515-*a*, a second multiplexer 515-*b*, a third multiplexer 515-*c*, and a fourth multiplexer 515-*d*. Each multiplexer may include a respective set of control lines (e.g., the first multiplexer 515-*a* may include a control line 560 and a control line 565, the second multiplexer 515-*b* may include a control line 570 and a control line 575, etc.). Moreover, each multiplexer may include one or more input lines. For example, the first multiplexer 515-*a* may include input lines 520-*a* and 520-*b*, the second multiplexer 515-*b* may include input lines 530-*a* and 530-*b*, the third multiplexer 515-*c* may include input lines 540-*a* and 540-*b*, and the fourth multiplexer 515-*d* may include input lines 550-*a* and 550-*b*.

The control lines of each multiplexer 515 may be configured to provide different signals to the respective multiplexer. For example, the control lines 560 and 580 may be configured to provide a first control signal (e.g., TmFzMode <0>) or a second control signal (e.g., TmFzMode <1>) to the first multiplexer 515-*a* and the third multiplexer 515-*c*. Additionally or alternatively, the control lines 570 and 590 may be configured to provide a first control signal or a fourth control signal (e.g., TmFzMode <3>) to the second multiplexer 515-*b* and the fourth multiplexer 515-*d*. Further, the control lines 565 and 575 may be configured to provide a third control signal (e.g., TmFzMode <2>) or a fourth control signal to the first multiplexer 515-*a* and the third multiplexer 515-*c*. Lastly, the control lines 575 and 595 may be configured to provide a second control signal or at third control signal to the second multiplexer 515-*b* and the fourth multiplexer 515-*d*.

Additionally or alternatively, each multiplexer 515 may include a respective output. For example, the first multiplexer 515-*a* may include output 525, the second multiplexer 515-*b* may include output 535, the third multiplexer 515-*c* may include output 545, and the fourth multiplexer 515-*d* may include output 555. As described herein, the circuitry 505 may be coupled with a set of fuses (e.g., a set of fuses 325 as described with reference to FIG. 3A). In some examples, the relative location of a blown fuse may set the path (e.g., the linked path) between the one or more of the plurality of multiplexers 515. For example, based on a location of a blown fuse, the output 525 may be provided to the input line 530-*a*, the output 535 may be provided to the input line 540-*a*, and so on.

In some examples, the circuitry 505 may receive a test mode signal from a controller to initiate a testing operation. For example, a first test mode signal may be provided to a respective control line of each multiplexer 515. In some examples, each multiplexer may include two control lines and the first test mode signal may be an example of a two-bit signal, one bit communicated over one line of the control lines. In some instances, the fourth multiplexer 515-*d* may be bypassed based on the first test mode signal being applied. However, in other instances, any one of the multiplexers 515 may be bypassed according to the fuse (or the set of fuses) that are blown to set a linked path. As described herein, the first test mode signal may configure the plurality of multiplexers 515 to select specific input lines.

In some instances, the first test mode signal may result in the incrementation of a first test counter, where the value of the first test counter is represented by one or more counter bits associated with (e.g., stored to) a first subset of memory cells. In such cases, the row of memory cells may be activated a first quantity of times, and the circuitry 405 may adjust one or more counter bits associated with the subset in response to each of the activates. In some examples, a first bit of the counter bits (e.g., a least significant bit) may be input to the input line 520-a of the first multiplexer 515-a. The bit may be output from the first multiplexer 515-a (e.g., via the output 525) and may be provided to the input line 530-a of the second multiplexer 515-b. The bit provided to the second multiplexer 515-b may represent a next-most-significant bit of the counter bits.

Additionally or alternatively, a bit may be output from the second multiplexer 515-b (e.g., via the output 535) and may be provided to the input line 540-a of the third multiplexer 515-c. The bit provided to the third multiplexer 515-c may represent a next-most-significant bit of the counter bits. In some instances, due to the test mode signal (e.g., due to the fourth multiplexer 515-d being bypassed due to the first test mode signal), the third multiplexer 515-c may output a bit to the GIO line 510 (e.g., via the output 545). In some instances, the bit may represent a most-significant bit of the counter bits.

In some cases, bit output from the multiplexer 515-c may include or be associated with a flag (e.g., first flag). The flag, which may be generated based on activating the row of memory cells a first quantity of times, may indicate an error condition associated with a subset of memory cells. As described herein, following the first quantity of activates, the counter bits of the subset may match an expected binary value (e.g., '1000'), and the first flag may include the most significant bit from the subset (e.g., '1'). If the value of the first flag matches the expected value (e.g., '1'), the first test counter associated with the subset may be incrementing correctly. If the value of the first flag does not match the expected value (e.g., '0'), the first test counter associated with the subset may not be incrementing correctly and there may be an error associated with the subset.

The circuitry 505 may similarly other subsets of memory cells (e.g., subsets 310-b through 310-d as described with reference to FIG. 3A). During such testing, the multiplexers 515 may receive corresponding test mode signaling via the respective control lines. For example, to test a second subset of memory cells, a second test mode signal (e.g., TmFzMode <1>) may be provided to a respective control line of each multiplexer 515. As described herein, each test mode signal may result in a respective multiplexer 515 being bypassed. In other instances, if errors are found associated with two of the subsets (e.g., if two or more flags are output via the GIO line 510), the testing operation may end and an associated row or bank of memory cells (or an associated memory die) may be discarded.

An example of how the plurality of multiplexers can route signals between the subsets of memory cells is described. The example row of memory cells may include four subsets of memory cells (e.g., a first subset of memory cells associated with the first circuitry 572, a second subset of memory cells associated with the second circuitry 574, a third subset of memory cells associated with the third circuitry 576, and a fourth subset of memory cells associated with the fourth circuitry 578) and a multiplexer associated with each subset of memory cells. The testing procedure may be used to determine if any of the subsets are associated with an error condition. The value of the counter may be designed to be stored by three subsets of memory cells. Thus, one of the subsets of the memory cells may be redundant. After a testing procedure a control signal for the plurality of multiplexers may be configured.

The inputs of the multiplexers may be coupled with various outputs of the different subsets of memory cells in such a way that one of the subsets of memory cells may cease to be used to store the value of the counter. In a first example, if the fourth subset is associated with an error condition, the multiplexers may be configured to create a linked path between the first subset, the second subset, and the third subset of memory cells to store the value of the counter. In such an example, the first subset may store the least significant bits of the value of the counter, the second subset may store the middle set of bits (e.g., the next-most-significant bits) of the value of the counter, and the third subset may store the most significant bits of the value of the counter. The flag may be output to the GIO line 510 in response to an overflow condition occurring at the third subset (which represents the most significant bits).

In a second example, if the first subset is associated with an error condition, the multiplexers may be configured to create a linked path between the second subset, the third subset, and the fourth subset to store the value of the counter. In such an example, the second subset may store the least significant bits of the value of the counter, the third subset may store the middle set of bits (e.g., the next-most-significant bits) of the value of the counter, and the fourth subset may store the most significant bits of the value of the counter. The flag may be output to the GIO line 510 in response to an overflow condition occurring at the fourth subset (which represents the most significant bits).

In a third example, if the second subset is associated with an error condition, the multiplexers may be configured to create a linked path between the third subset, the fourth subset, and the first subset to store the value of the counter. In such an example, the third subset may store the least significant bits of the value of the counter, the fourth subset may store the middle set of bits (e.g., the next-most-significant bits) of the value of the counter, and the first subset may store the most significant bits of the value of the counter. The flag may be output to the GIO line 510 in response to an overflow condition occurring at the first subset (which represents the most significant bits).

In a fourth example, if the third subset is associated with an error condition, the multiplexers may be configured to create a linked path between the fourth subset, the first subset, and the second subset to store the value of the counter. In such an example, the fourth subset may store the least significant bits of the value of the counter, the first subset may store the middle set of bits (e.g., the next-most-significant bits) of the value of the counter, and the second subset may store the most significant bits of the value of the counter. The flag may be output to the GIO line 510 in response to an overflow condition occurring at the second subset (which represents the most significant bits).

As described herein, each multiplexer may be coupled with respective circuitry via a line (e.g., an output line). For example, the first multiplexer 515-a may be coupled with first circuitry 572 via an output line 525, the second multiplexer 515-b may be coupled with second circuitry 574 via an output line 535, the third multiplexer 515-c may be coupled with third circuitry 576 via an output line 545, and the fourth multiplexer 515-d may be coupled with fourth circuitry 578 via an output line 555.

In some examples, the respective circuitry may be integrated with (e.g., coupled to) to a memory bank (e.g., to one or more subsets of memory cells and may be selectively coupled to the GIO line 510. The circuitry may be configured to maintain (e.g., increment) the value of a counter for each respective subset of memory cells. In some examples, the respective circuitry may include one or more (e.g., one or more adders 580, such as adder 580-a, adder 580-b, adder 580-c, and adder 580-d), where the adders may each increment respective values of the counter for each of the subsets of memory cells. In such examples, an adder may be configured to increment the value of a counter in response to an activation of the corresponding row, where the adder may adjust (e.g., update) the value of one or more bits of the set of bits representing the value of the counter.

In some examples, each circuitry may be configured to output one or more bits (e.g., a flag) to the GIO line 510 or to a multiplexer. For example, the line 562 (e.g., the output line 562) may output one or more bits to the GIO line 510 or to the second multiplexer 515-*b*. Similarly, the line 564 (e.g., the output line 564) may output one or more bits to the GIO line 510 or to the third multiplexer 515-*c*, the line 566 (e.g., the output line 566) may output one or more bits to the GIO line 510 or to the fourth multiplexer 515-*d*, and the line 568 (e.g., the output line 568) may output one or more bits to the GIO line 510 or to the first multiplexer 515-*a*.

As described herein, in a first example, if the fourth subset of memory cells is associated with an error condition, the multiplexers may be configured to create a linked path between the first subset, the second subset, and the third subset of memory cells to store the value of the counter. In such an example, the first subset may store the least significant bits of the value of the counter, the second subset may store the middle set of bits (e.g., the next-most-significant bits) of the value of the counter, and the third subset may store the most significant bits of the value of the counter. The flag may be output to the GIO line 510 in response to an overflow condition occurring at the third subset (which represents the most significant bits).

By validating the counter, an associated memory die may ensure that the row hammer mitigation scheme (e.g., a deterministic scheme) associated with the counter is valid. Accordingly, the memory die may mitigate the likelihood of row hammering, and such testing may improve the overall performance of the memory die.

By validating the counter (e.g., the set of memory cells), an associated memory die may ensure that the row hammer mitigation scheme (e.g., a deterministic scheme) associated with the counter is valid. Accordingly, the memory die may mitigate the likelihood of row hammering, and such testing may improve the overall performance of the memory die.

Figure 6:
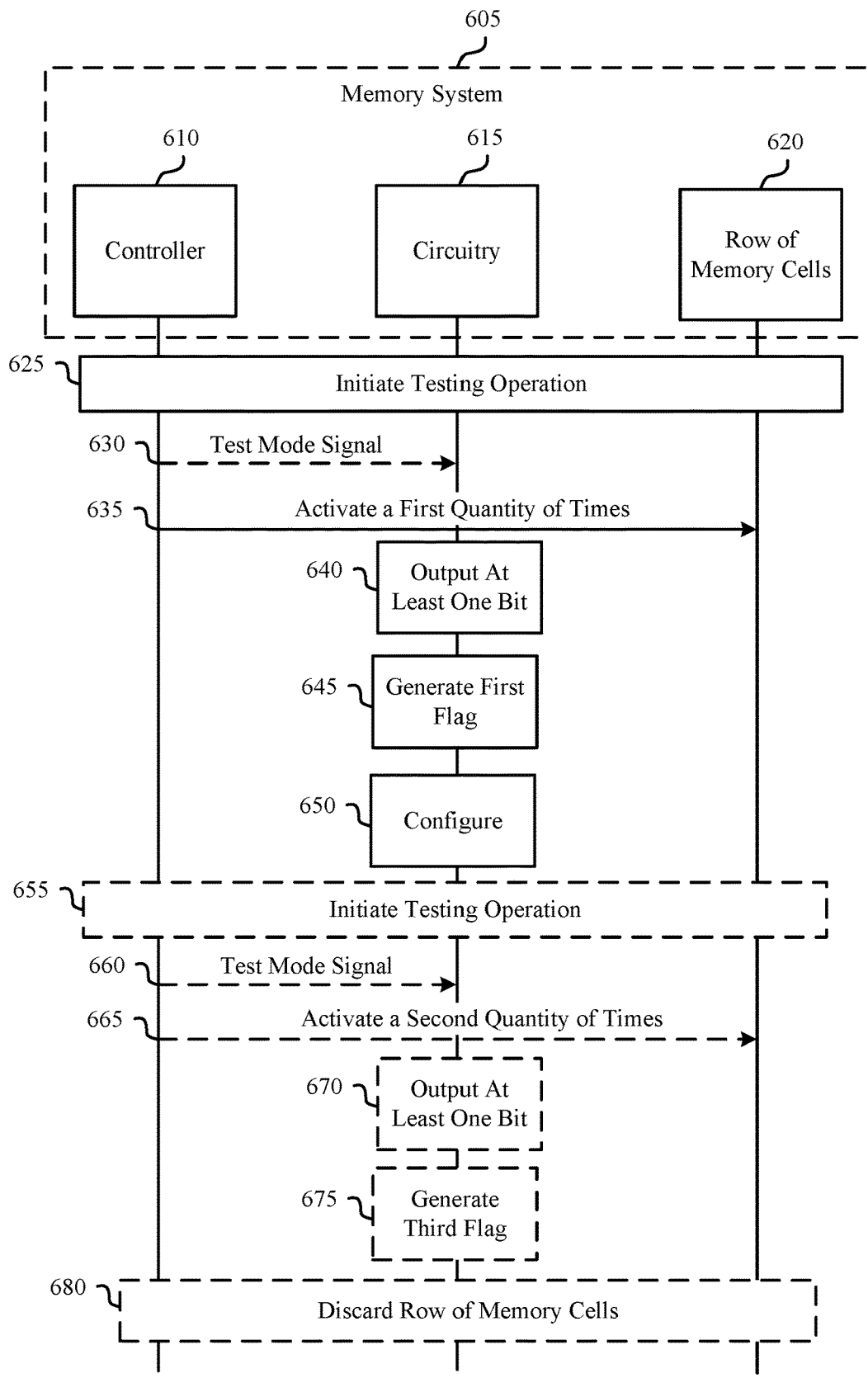
FIG. 6 illustrates an example of a process flow diagram that supports counter management for memory systems in accordance with examples as disclosed herein.

FIG. 6 illustrates an example of a process flow diagram 600 that supports counter management for memory systems in accordance with examples as disclosed herein. Aspects of the process flow diagram 600 may be implemented by a memory system 605 as described with reference to FIGS. 2 through 5. The memory system 605 may include aspects of the memory die 300-*a* as described with reference to FIG. 3A. For example, the memory system 605 may include a controller 610, circuitry 615 and a row of memory cells 620. In such cases, the circuitry 615 may include a plurality of multiplexers and may be configured to test a counter associated with the row of memory cells 620. The process flow diagram 600 may depict a process for testing of a localized counter associated with a row of memory cells. Testing localized counters may validate (or invalidate) a row hammer mitigation scheme implemented by the memory system 605.

In some cases, one or more aspects of the process flow diagram 600 may be implemented by a controller (e.g., among other components), of the memory system 605. Additionally or alternatively, the aspects of the process flow diagram 600 may be implemented as instructions stored in the memory system 605, or by the circuitry of the memory system 605. For example, the instructions, if executed by a controller, may cause the memory system 605 to perform one or more of the operations of the process flow diagram 600. Alternative examples of the process flow diagram 600 may be implemented in which some operations are performed in a different order than described, or not performed at all. In some cases, operations may include features not mentioned below, or additional operations may be added.

At 625, the memory system 605 may initiate a testing operation. For example, the memory system 605 may initiate the testing operation based a flag indicating an overflow condition transmitted by the circuitry 615 and associated with the row of memory cells 620. In some examples, the testing operation may include testing a counter associated with the row of memory cells 620, where a value of the counter is stored to a set of memory cells of the row of memory cells 620. For example, the testing operation may be associated with a first subset of memory cells of the set of memory cells to determine if the first subset includes or is otherwise associated with an error.

At 630, the circuitry 615 may receive a test mode signal from the controller 610. For example, the circuitry 615 may receive the test mode signal, where the test mode signal is associated with the first subset. In such examples, the circuitry 615 may select, based on the test mode signal, a first input line of a first multiplexer of the circuitry 615. Selecting the first input line of the first multiplexer may set a linked path through the plurality of multiplexers for performing the testing operation.

At 635, the controller 610 may activate the row of memory cells 620 a first quantity of times. For example, the controller 610 may activate the row of memory cells 620 a first quantity of times, and the circuitry 615 may be configured to increment a test counter associated with the first subset (e.g., including one or more bits stored to the first subset) in accordance with the linked path configured at 630.

At 640, the circuitry 615 may output at least one bit from the first multiplexer to a second multiplexer in response to activating the row of memory cells 620. In such cases, the first bit may be input via the first input line to the first multiplexer and may be output from the first multiplexer to a first input line of the second multiplexer. In some instances, inputting a bit to the first multiplexer may be based on activating the row of memory cells a first time (e.g., of the first quantity of times) and inputting the bit to the second multiplexer may be based on activating the row of memory cells a second time (e.g., of the first quantity of times). In some cases, the bit may represent a least significant bit of the first subset as an input to the first multiplexer, and may represent a next most significant bit as an input to the second multiplexer. That is, a relative location of the bit (e.g., relative to multiplexers of the plurality of multiplexers) may indicate a significance of the bit.

At 645, the circuitry 615 may generate a first flag indicating an error condition of the first subset. For example, the circuitry 615 may generate the first flag based on outputting the at least one bit from the first multiplexer to a second multiplexer. In such cases, the first flag may include a most significant bit from the first subset after the incrementation (e.g., output from a third multiplexer). In some cases, the most significant bit may not match an expected value (e.g., '1'), indicating that the test counter associated with the first subset did not increment correctly during the third testing operation. As such, the first subset may include or otherwise be associated with an error. The circuitry 615 may transmit the first flag to the controller 610 via a global input/output (GIO) line.

At 650, the circuitry 615 may configure the plurality of multiplexers based on the first flag (e.g., based on a command from the controller 610 in response to the first flag).

For example, the circuitry may activate (e.g., blow) a first fuse associated with the first flag to configure the plurality of multiplexers, where the plurality of multiplexers may be configured to store the value of the counter to a second subset of the set of memory cells and refrain from storing the value of the counter to the first subset. As such, configuring the set of multiplexers may result in the first subset being redundant to the value of the counter, thus accounting for (e.g., correcting) an error associated with the first subset.

At 655, the memory system 605 may initiate a testing operation. For example, the memory system 605 may initiate a testing operation based on (e.g., following) the testing operation at 625. In such examples, the testing operation may be associated with a third subset of the set of memory cells storing the value of the counter, and may determine whether the third subset includes or is otherwise associated with an error.

At 660, the circuitry 615 may receive a test mode signal from the controller 610, where the test mode signal may be associated with the third subset. In some examples the circuitry 615 may select, based on the test mode signal, a second input line of the first multiplexer. Selecting the second input line of the first multiplexer may configure (e.g., configure in part) a linked path through the plurality of multiplexers for performing the testing operation.

At 665, the controller 610 may activate the row of memory cells 620 a second quantity of times. For example, the controller 610 may activate the row of memory cells 620 a first quantity of times, and the circuitry 615 may be configured to increment a test counter associated with the third subset (e.g., including one or more bits stored to the third subset) in accordance with the linked path configured at 660.

At 670, the circuitry 615 may output at least one bit from a third multiplexer of the plurality of multiplexers to a fourth multiplexer of the plurality of multiplexers based on activating the row of memory cells 620 a second quantity of times. In some cases, the bit may represent a least significant bit of the third subset as an input to the third multiplexer, and may represent a next most significant bit as an input to the fourth multiplexer, At 675, the circuitry 615 may generate a third flag indicating an error condition of the third subset. For example, the circuitry 615 may generate the third flag based on outputting the at least one from the third multiplexer to the fourth multiplexer. In such cases, the third flag may include a most significant bit from the third subset after the incrementation (e.g., output from the first multiplexer). In some cases, the most significant bit may not match an expected value (e.g., '1'), indicating that the test counter associated with the third subset did not increment correctly during the testing operation. As such, the third subset may include or otherwise be associated with an error. The circuitry 615 may transmit the third flag to the controller 610 via the GIO line.

At 680, the memory system 605 may discard the row of memory cells 620. For example, the memory system 605 may discard the row of memory cells 620 based on the first flag and the third flag (e.g., based on two or more errors associated with the set of memory cells storing the value of the counter). In such examples, discarding the row of memory cells may include discarding a bank of memory cells or a memory die including the row of memory cells 620. The memory system 605 may discard the row of memory cells 620 because the counter associated with the row of memory cells 620 is invalid and, by extension, a row hammer mitigation scheme utilizing the counter may be invalid as well.

In such examples, the memory system 605 may be configured to validate (or invalidate) localized counters associated with respective rows of memory cells. Such tests may ensure that the memory system 605 is operating in accordance with a row hammer mitigation scheme.

Figure 7:
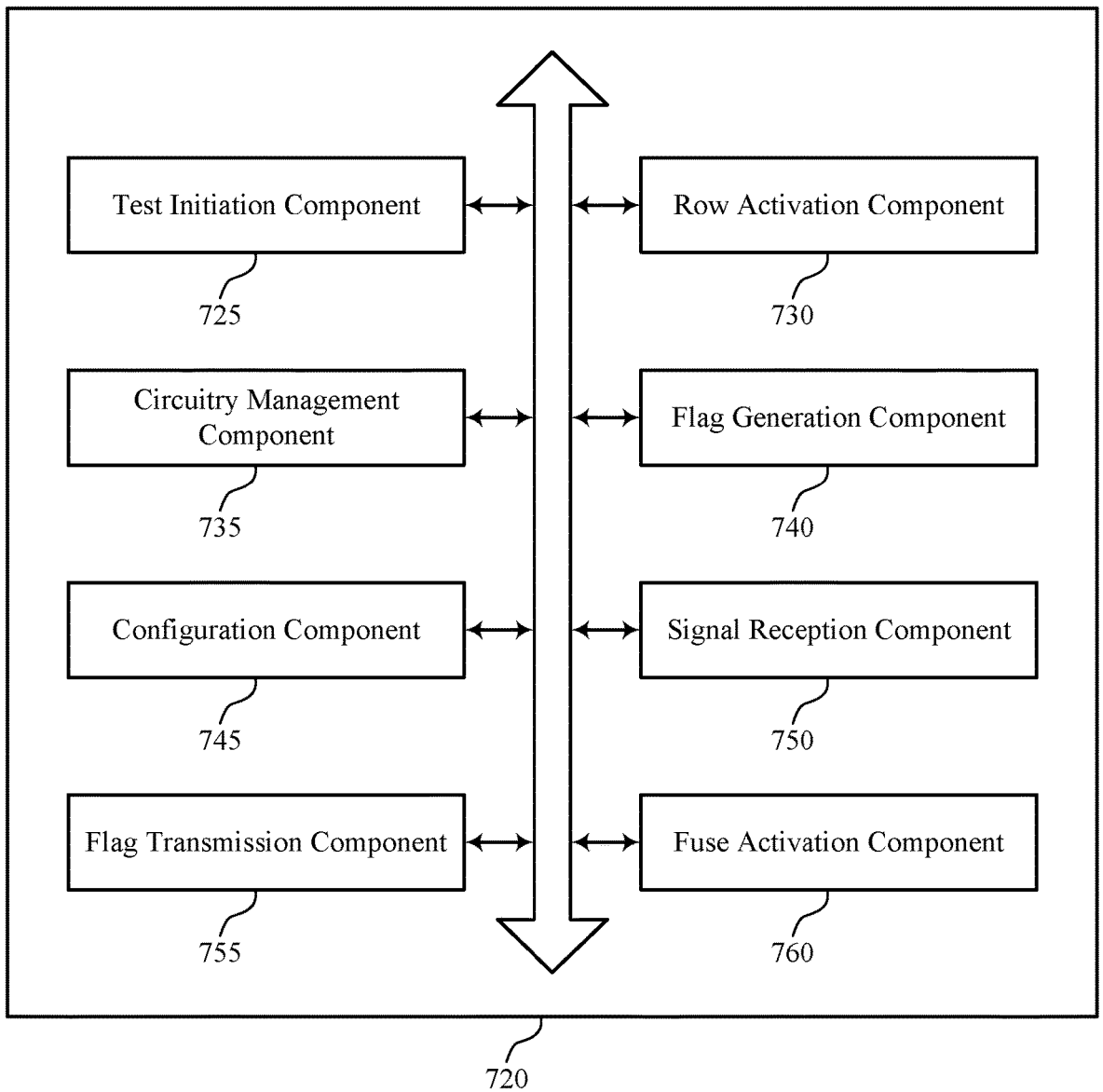
FIG. 7 shows a block diagram of a memory system that supports counter management for memory systems in accordance with examples as disclosed herein.

FIG. 7 shows a block diagram 700 of a memory system 720 that supports counter management for memory systems in accordance with examples as disclosed herein. The memory system 720 may be an example of aspects of a memory system as described with reference to FIGS. 1 through 6. The memory system 720, or various components thereof, may be an example of means for performing various aspects of counter management for memory systems as described herein. For example, the memory system 720 may include a test initiation component 725, a row activation component 730, a circuitry management component 735, a flag generation component 740, a configuration component 745, a signal reception component 750, a flag transmission component 755, a fuse activation component 760, or any combination thereof. Each of these components may communicate, directly or indirectly, with one another (e.g., via one or more buses).

The test initiation component 725 may be configured as or otherwise support a means for initiating, by a memory system including a first row of memory cells that includes a set of memory cells for storing a value of a counter, a first testing operation on a first subset of the set of memory cells, where the set of memory cells includes a second subset and the value of the counter is associated with the first row of memory cells. The row activation component 730 may be configured as or otherwise support a means for activating the first row of memory cells a first quantity of times based at least in part on initiating the first testing operation. The circuitry management component 735 may be configured as or otherwise support a means for outputting, by circuitry coupled with the first row of memory cells that includes a plurality of multiplexers, at least one bit of the first subset from a first multiplexer of the plurality of multiplexers to a second multiplexer of the plurality of multiplexers based at least in part on activating the first row of memory cells the first quantity of times. The flag generation component 740 may be configured as or otherwise support a means for generating a first flag indicating an error condition of the first subset based at least in part on outputting the at least one bit from the first multiplexer to the second multiplexer. The configuration component 745 may be configured as or otherwise support a means for configuring the plurality of multiplexers to use the second subset to store the value of the counter and to refrain from using the first subset to store the value of the counter based at least in part on the first flag.

In some examples, the signal reception component 750 may be configured as or otherwise support a means for receiving a first test mode signal, where the first test mode signal is associated with the first subset. In some examples, the circuitry management component 735 may be configured as or otherwise support a means for selecting, based at least in part on the first test mode signal, a first input line of the first multiplexer of the plurality of multiplexers, where generating the first flag is based at least in part on selecting the first input line of the first multiplexer of the plurality of multiplexers.

In some examples, to support generating the first flag, the row activation component 730 may be configured as or otherwise support a means for activating the first row of memory cells a first time. In some examples, to support generating the first flag, the circuitry management component 735 may be configured as or otherwise support a means for outputting, to the first input line of the first multiplexer, a first bit of the first subset based at least in part on activating the first row of memory cells the first time, where the first bit represents a least significant bit associated with the first subset. In some examples, to support generating the first flag, the row activation component 730 may be configured as or otherwise support a means for activating the first row of memory cells a second time. In some examples, to support generating the first flag, the circuitry management component 735 may be configured as or otherwise support a means for outputting, from the first multiplexer to a first input line of the second multiplexer, the first bit of the first subset based at least in part on activating the first row of memory cells the second time, where the first bit represents a next significant bit associated with the first subset.

In some examples, the signal reception component 750 may be configured as or otherwise support a means for receiving a second test mode signal, where the second test mode signal is associated with the second subset. In some examples, the circuitry management component 735 may be configured as or otherwise support a means for selecting, based at least in part on the second test mode signal, a third input line of the first multiplexer of the plurality of multiplexers, where the first multiplexer includes the third input line and a fourth input line. In some examples, the flag generation component 740 may be configured as or otherwise support a means for generating, during a second testing operation, a second flag indicating an error condition of the second subset.

In some examples, the test initiation component 725 may be configured as or otherwise support a means for initiating a third testing operation on a third subset of the set of memory cells. In some examples, the row activation component 730 may be configured as or otherwise support a means for activating the first row of memory cells a second quantity of times based at least in part on initiating the third testing operation. In some examples, the circuitry management component 735 may be configured as or otherwise support a means for outputting, by the circuitry, at least one bit of the third subset from a third multiplexer of the plurality of multiplexers to a fourth multiplexer of the plurality of multiplexers based at least in part on activating the first row of memory cells the second quantity of times. In some examples, the flag generation component 740 may be configured as or otherwise support a means for generating, by the circuitry, a third flag indicating an error condition of the third subset based at least in part on outputting the at least one bit of the third subset from the third multiplexer to the fourth multiplexer.

In some examples, the signal reception component 750 may be configured as or otherwise support a means for receiving a third test mode signal, where the third test mode signal is associated with the third subset. In some examples, the circuitry management component 735 may be configured as or otherwise support a means for selecting, based at least in part on the third test mode signal, a second input line of the first multiplexer of the plurality of multiplexers, where generating the third flag is based at least in part on selecting the second input line of the first multiplexer.

In some examples, the signal reception component 750 may be configured as or otherwise support a means for receiving a fourth test mode signal, where the fourth test mode signal is associated with a fourth subset of the set of memory cells. In some examples, the configuration component 745 may be configured as or otherwise support a means for selecting, based at least in part on the fourth test mode signal, the second input line of the first multiplexer. In some examples, the flag generation component 740 may be configured as or otherwise support a means for generating, during a fourth testing operation, a fourth flag indicating an error condition of the fourth subset.

In some examples, the circuitry management component 735 may be configured as or otherwise support a means for discarding at least the first row of memory cells based at least in part on the first flag and the third flag.

In some examples, the first flag includes a most significant bit associated with the first subset after activating the first row of memory cells the first quantity of times.

In some examples, the flag transmission component 755 may be configured as or otherwise support a means for transmitting the first flag via a global/input (GIO) line of the memory system based at least in part on generating the first flag, where configuring the plurality of multiplexers to use the second subset to store the value of the counter and refraining from using the first subset to store the value of the counter is based at least in part on transmitting the first flag.

In some examples, the fuse activation component 760 may be configured as or otherwise support a means for activating a fuse coupled with the first row of memory cells and associated with the first subset, where configuring the plurality of multiplexers to use the second subset to store the value of the counter and refraining from using the first subset to store the value of the counter is based at least in part on activating the fuse.

Figure 8:
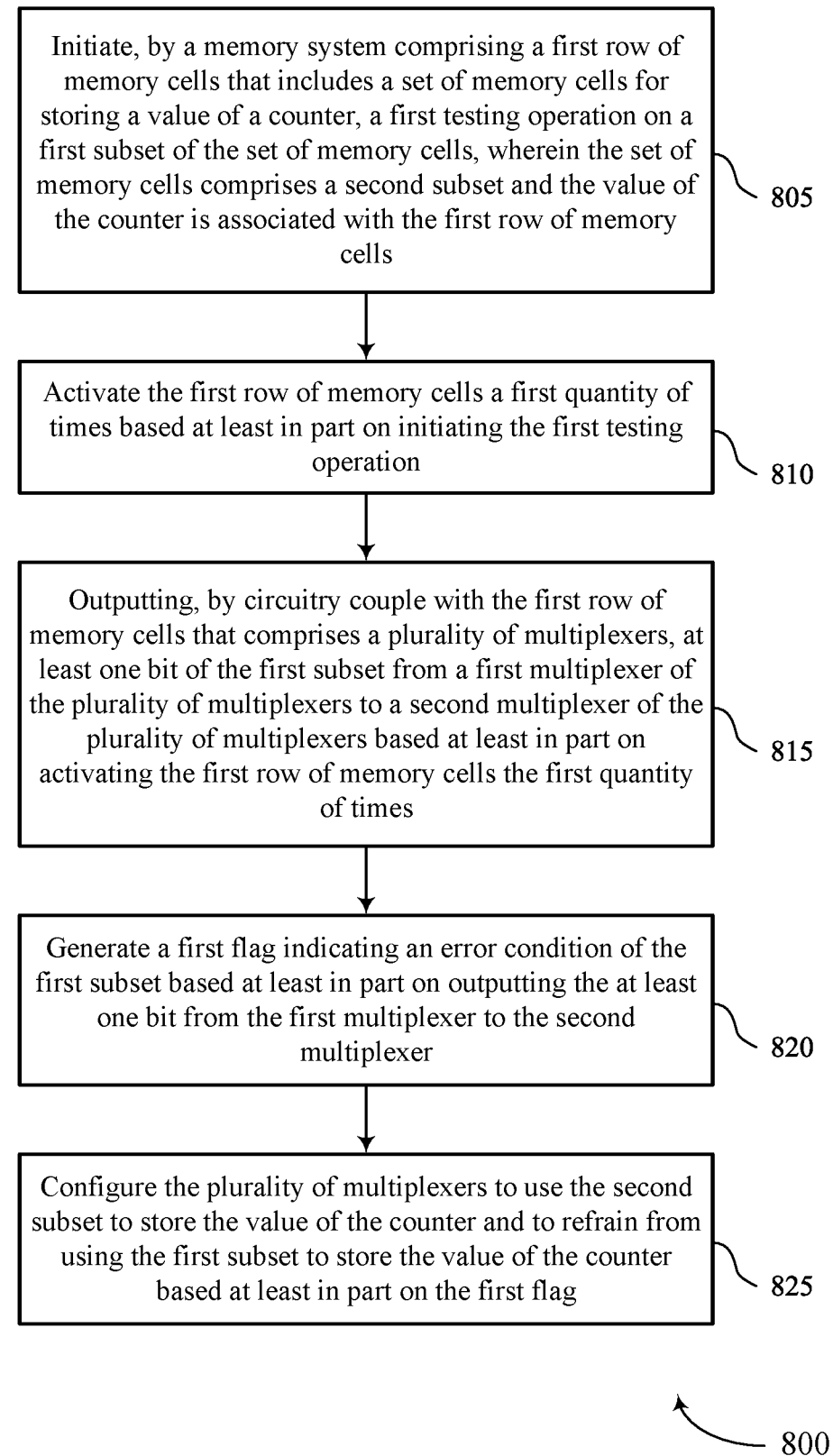
FIG. 8 shows a flowchart illustrating a method or methods that support counter management for memory systems in accordance with examples as disclosed herein.

FIG. 8 shows a flowchart illustrating a method 800 that supports counter management for memory systems in accordance with examples as disclosed herein. The operations of method 800 may be implemented by a memory system or its components as described herein. For example, the operations of method 800 may be performed by a memory system as described with reference to FIGS. 1 through 7. In some examples, a memory system may execute a set of instructions to control the functional elements of the device to perform the described functions. Additionally, or alternatively, the memory system may perform aspects of the described functions using special-purpose hardware.

At 805, the method may include initiating, by a memory system including a first row of memory cells that includes a set of memory cells for storing a value of a counter, a first testing operation on a first subset of the set of memory cells, where the set of memory cells includes a second subset and the value of the counter is associated with the first row of memory cells. The operations of 805 may be performed in accordance with examples as disclosed herein. In some examples, aspects of the operations of 805 may be performed by a test initiation component 725 as described with reference to FIG. 7.

At 810, the method may include activating the first row of memory cells a first quantity of times based at least in part on initiating the first testing operation. The operations of 810 may be performed in accordance with examples as disclosed herein. In some examples, aspects of the operations of 810 may be performed by a row activation component 730 as described with reference to FIG. 7.

At 815, the method may include outputting, by circuitry coupled with the first row of memory cells that includes a plurality of multiplexers, at least one bit of the first subset from a first multiplexer of the plurality of multiplexers to a second multiplexer of the plurality of multiplexers based at least in part on activating the first row of memory cells the first quantity of times. The operations of 815 may be performed in accordance with examples as disclosed herein. In some examples, aspects of the operations of 815 may be performed by a circuitry management component 735 as described with reference to FIG. 7.

At 820, the method may include generating a first flag indicating an error condition of the first subset based at least in part on outputting the at least one bit from the first multiplexer to the second multiplexer. The operations of 820 may be performed in accordance with examples as disclosed herein. In some examples, aspects of the operations of 820 may be performed by a flag generation component 740 as described with reference to FIG. 7.

At 825, the method may include configuring the plurality of multiplexers to use the second subset to store the value of the counter and to refrain from using the first subset to store the value of the counter based at least in part on the first flag. The operations of 825 may be performed in accordance with examples as disclosed herein. In some examples, aspects of the operations of 825 may be performed by a configuration component 745 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for initiating, by a memory system including a first row of memory cells that includes a set of memory cells for storing a value of a counter, a first testing operation on a first subset of the set of memory cells, where the set of memory cells includes a second subset and the value of the counter is associated with the first row of memory cells; activating the first row of memory cells a first quantity of times based at least in part on initiating the first testing operation; outputting, by circuitry coupled with the first row of memory cells that includes a plurality of multiplexers, at least one bit of the first subset from a first multiplexer of the plurality of multiplexers to a second multiplexer of the plurality of multiplexers based at least in part on activating the first row of memory cells the first quantity of times; generating a first flag indicating an error condition of the first subset based at least in part on outputting the at least one bit from the first multiplexer to the second multiplexer; and configuring the plurality of multiplexers to use the second subset to store the value of the counter and to refrain from using the first subset to store the value of the counter based at least in part on the first flag.

Aspect 2: The method, apparatus, or non-transitory computer-readable medium of aspect 1, further including operations, features, circuitry, logic, means, or instructions, or any combination thereof for receiving a first test mode signal, where the first test mode signal is associated with the first subset and selecting, based at least in part on the first test mode signal, a first input line of the first multiplexer of the plurality of multiplexers, where generating the first flag is based at least in part on selecting the first input line of the first multiplexer of the plurality of multiplexers.

Aspect 3: The method, apparatus, or non-transitory computer-readable medium of aspect 2, where generating the first flag includes operations, features, circuitry, logic, means, or instructions, or any combination thereof for activating the first row of memory cells a first time; outputting, to the first input line of the first multiplexer, a first bit of the first subset based at least in part on activating the first row of memory cells the first time, where the first bit represents a least significant bit associated with the first subset; activating the first row of memory cells a second time; and outputting, from the first multiplexer to a first input line of the second multiplexer, the first bit of the first subset based at least in part on activating the first row of memory cells the second time, where the first bit represents a next significant bit associated with the first subset.

Aspect 4: The method, apparatus, or non-transitory computer-readable medium of any of aspects 1 through 3, further including operations, features, circuitry, logic, means, or instructions, or any combination thereof for receiving a second test mode signal, where the second test mode signal is associated with the second subset; selecting, based at least in part on the second test mode signal, a third input line of the first multiplexer of the plurality of multiplexers, where the first multiplexer includes the third input line and a fourth input line; and generating, during a second testing operation, a second flag indicating an error condition of the second subset.

Aspect 5: The method, apparatus, or non-transitory computer-readable medium of any of aspects 1 through 4, further including operations, features, circuitry, logic, means, or instructions, or any combination thereof for initiating a third testing operation on a third subset of the set of memory cells; activating the first row of memory cells a second quantity of times based at least in part on initiating the third testing operation; outputting, by the circuitry, at least one bit of the third subset from a third multiplexer of the plurality of multiplexers to a fourth multiplexer of the plurality of multiplexers based at least in part on activating the first row of memory cells the second quantity of times; and generating, by the circuitry, a third flag indicating an error condition of the third subset based at least in part on outputting the at least one bit of the third subset from the third multiplexer to the fourth multiplexer.

Aspect 6: The method, apparatus, or non-transitory computer-readable medium of aspect 5, further including operations, features, circuitry, logic, means, or instructions, or any combination thereof for receiving a third test mode signal, where the third test mode signal is associated with the third subset and selecting, based at least in part on the third test mode signal, a second input line of the first multiplexer of the plurality of multiplexers, where generating the third flag is based at least in part on selecting the second input line of the first multiplexer.

Aspect 7: The method, apparatus, or non-transitory computer-readable medium of aspect 6, further including operations, features, circuitry, logic, means, or instructions, or any combination thereof for receiving a fourth test mode signal, where the fourth test mode signal is associated with a fourth subset of the set of memory cells; selecting, based at least in part on the fourth test mode signal, the second input line of the first multiplexer; and generating, during a fourth testing operation, a fourth flag indicating an error condition of the fourth subset.

Aspect 8: The method, apparatus, or non-transitory computer-readable medium of any of aspects 5 through 7, further including operations, features, circuitry, logic, means, or instructions, or any combination thereof for discarding at least the first row of memory cells based at least in part on the first flag and the third flag.

Aspect 9: The method, apparatus, or non-transitory computer-readable medium of any of aspects 1 through 8, where the first flag includes a most significant bit associated with the first subset after activating the first row of memory cells the first quantity of times.

Aspect 10: The method, apparatus, or non-transitory computer-readable medium of any of aspects 1 through 9, further including operations, features, circuitry, logic, means, or instructions, or any combination thereof for transmitting the first flag via a global/input (GIO) line of the memory system based at least in part on generating the first flag, where configuring the plurality of multiplexers to use the second subset to store the value of the counter and refraining from using the first subset to store the value of the counter is based at least in part on transmitting the first flag.

Aspect 11: The method, apparatus, or non-transitory computer-readable medium of any of aspects 1 through 10, further including operations, features, circuitry, logic, means, or instructions, or any combination thereof for activating a fuse coupled with the first row of memory cells and associated with the first subset, where configuring the plurality of multiplexers to use the second subset to store the value of the counter and refraining from using the first subset to store the value of the counter is based at least in part on activating the fuse.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 12: An apparatus, including: a first row of memory cells that includes a set of memory cells for storing a value of a counter associated with the first row of memory cells, the set of memory cells including a first subset and a second subset; and circuitry coupled with the first row of memory cells and including a plurality of multiplexers, where the circuitry is configured to: output, during a first testing operation, at least one bit of the first subset from a first multiplexer of the plurality of multiplexers to a second multiplexer of the plurality of multiplexers based at least in part on the first row of memory cells being activated a first quantity of times; generate a first flag indicating an error condition of the first subset based at least in part on outputting the at least one bit of the first subset from the first multiplexer to the second multiplexer; and configure the plurality of multiplexers to use the second subset to store the value of the counter and to refrain from using the first subset to store the value of the counter based at least in part on the first flag.

Aspect 13: The apparatus of aspect 12, where the circuitry is configured to: select, based at least in part on receiving a first test mode signal, a first input line of the first multiplexer of the plurality of multiplexers, where generating the first flag is based at least in part on selecting the first input line of the first multiplexer of the plurality of multiplexers.

Aspect 14: The apparatus of aspect 13, where generating the first flag includes: receiving, by the first multiplexer, a first bit stored to the first subset based at least in part on the first row of memory cells being activated a first time, where the first bit represents a least significant bit associated with the first subset; and outputting, from the first multiplexer to a first input line of the second multiplexer, the first bit based at least in part on activating the first row of memory cells a second time, where the first bit represents a next significant bit associated with the first subset.

Aspect 15: The apparatus of aspect 14, where the circuitry is further configured to: output, during a second testing operation, at least one bit of the second subset from a third multiplexer of the plurality of multiplexers to a first input line of a fourth multiplexer of the plurality of multiplexers based at least in part on the first row of memory cells being activated a second quantity of times; and generate a second flag indicating an error condition of the second subset based at least in part on outputting the at least one bit from the third multiplexer to the first input line of the fourth multiplexer.

Aspect 16: The apparatus of any of aspects 12 through 15, where the apparatus further includes a global input/output (GIO) line coupled with the circuitry, and where the circuitry is further configured to: transmit the first flag via the GIO line based at least in part on generating the first flag.

Aspect 17: The apparatus of aspect 16, where the apparatus further includes an array of fuses coupled with the first row of memory cells, and where the circuitry is further configured to: activate at least one fuse of the array of fuses based at least in part on the first flag, where configuring the plurality of multiplexers to use the second subset to store the value of the counter and refraining from using the first subset to store the value of the counter is based at least in part on activating the at least one fuse of the array of fuses.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory system, comprising:
   a first row of memory cells that includes a set of memory cells for storing a value of a counter associated with the first row of memory cells, the set of memory cells comprising a first subset and a second subset; and
   processing circuitry coupled with the first row of memory cells and comprising a plurality of multiplexers, wherein the processing circuitry is configured to cause the memory system to:
   output, during a first testing operation, at least one bit of the first subset from a first multiplexer of the plurality of multiplexers to a second multiplexer of the plurality of multiplexers based at least in part on the first row of memory cells being activated a first quantity of times;
   generate a first flag indicating an error condition of the first subset based at least in part on outputting the at least one bit of the first subset from the first multiplexer to the second multiplexer; and
   configure the plurality of multiplexers to use the second subset to store the value of the counter and to refrain from using the first subset to store the value of the counter based at least in part on the first flag.

2. The memory system of claim 1, wherein the processing circuitry is configured to cause the memory system to:
   select, based at least in part on receiving a first test mode signal, a first input line of the first multiplexer of the plurality of multiplexers, wherein generating the first flag is based at least in part on selecting the first input line of the first multiplexer of the plurality of multiplexers.

3. The memory system of claim 2, wherein to generate the first flag, the processing circuitry is configured to cause the memory system to:
   receive, by the first multiplexer, a first bit stored to the first subset based at least in part on the first row of memory cells being activated a first time, wherein the first bit represents a least significant bit associated with the first subset; and
   output, from the first multiplexer to a first input line of the second multiplexer, the first bit based at least in part on activating the first row of memory cells a second time, wherein the first bit represents a next significant bit associated with the first subset.

4. The memory system of claim 3, wherein the processing circuitry is further configured to cause the memory system to:
   output, during a second testing operation, at least one bit of the second subset from a third multiplexer of the plurality of multiplexers to a first input line of a fourth multiplexer of the plurality of multiplexers based at least in part on the first row of memory cells being activated a second quantity of times; and
   generate a second flag indicating an error condition of the second subset based at least in part on outputting the at least one bit from the third multiplexer to the first input line of the fourth multiplexer.

5. The memory system of claim 1, wherein the memory system further comprises a global input/output (GIO) line coupled with the processing circuitry, and wherein the processing circuitry is further configured to cause the memory system to:
   transmit the first flag via the GIO line based at least in part on generating the first flag.

6. The memory system of claim 5, wherein the memory system further comprises an array of fuses coupled with the first row of memory cells, and wherein the processing circuitry is further configured to cause the memory system to:
   activate at least one fuse of the array of fuses based at least in part on the first flag, wherein configuring the plurality of multiplexers to use the second subset to store the value of the counter and refraining from using the first subset to store the value of the counter is based at least in part on activating the at least one fuse of the array of fuses.

7. A method, comprising:
   initiating, by a memory system comprising a first row of memory cells that includes a set of memory cells for storing a value of a counter, a first testing operation on a first subset of the set of memory cells, wherein the set of memory cells comprises a second subset and the value of the counter is associated with the first row of memory cells;
   activating the first row of memory cells a first quantity of times based at least in part on initiating the first testing operation;
   outputting, by circuitry coupled with the first row of memory cells that comprises a plurality of multiplexers, at least one bit of the first subset from a first multiplexer of the plurality of multiplexers to a second multiplexer of the plurality of multiplexers based at least in part on activating the first row of memory cells the first quantity of times;
   generating a first flag indicating an error condition of the first subset based at least in part on outputting the at least one bit from the first multiplexer to the second multiplexer; and
   configuring the plurality of multiplexers to use the second subset to store the value of the counter and to refrain from using the first subset to store the value of the counter based at least in part on the first flag.

8. The method of claim 7, further comprising:
   receiving a first test mode signal, wherein the first test mode signal is associated with the first subset; and
   selecting, based at least in part on the first test mode signal, a first input line of the first multiplexer of the plurality of multiplexers, wherein generating the first flag is based at least in part on selecting the first input line of the first multiplexer of the plurality of multiplexers.

9. The method of claim 8, wherein generating the first flag comprises:
   activating the first row of memory cells a first time;
   outputting, to the first input line of the first multiplexer, a first bit of the first subset based at least in part on activating the first row of memory cells the first time, wherein the first bit represents a least significant bit associated with the first subset;
   activating the first row of memory cells a second time; and outputting, from the first multiplexer to a first input line of the second multiplexer, the first bit of the first subset based at least in part on activating the first row of memory cells the second time, wherein the first bit represents a next significant bit associated with the first subset.

10. The method of claim 7, further comprising:
receiving a second test mode signal, wherein the second test mode signal is associated with the second subset;
selecting, based at least in part on the second test mode signal, a third input line of the first multiplexer of the plurality of multiplexers, wherein the first multiplexer comprises the third input line and a fourth input line; and
generating, during a second testing operation, a second flag indicating an error condition of the second subset.

11. The method of claim 7, further comprising:
initiating a third testing operation on a third subset of the set of memory cells;
activating the first row of memory cells a second quantity of times based at least in part on initiating the third testing operation;
outputting, by the circuitry, at least one bit of the third subset from a third multiplexer of the plurality of multiplexers to a fourth multiplexer of the plurality of multiplexers based at least in part on activating the first row of memory cells the second quantity of times; and
generating, by the circuitry, a third flag indicating an error condition of the third subset based at least in part on outputting the at least one bit of the third subset from the third multiplexer to the fourth multiplexer.

12. The method of claim 11, further comprising:
receiving a third test mode signal, wherein the third test mode signal is associated with the third subset; and
selecting, based at least in part on the third test mode signal, a second input line of the first multiplexer of the plurality of multiplexers, wherein generating the third flag is based at least in part on selecting the second input line of the first multiplexer.

13. The method of claim 12, further comprising:
receiving a fourth test mode signal, wherein the fourth test mode signal is associated with a fourth subset of the set of memory cells;
selecting, based at least in part on the fourth test mode signal, the second input line of the first multiplexer; and
generating, during a fourth testing operation, a fourth flag indicating an error condition of the fourth subset.

14. The method of claim 11, further comprising:
discarding at least the first row of memory cells based at least in part on the first flag and the third flag.

15. The method of claim 7, wherein the first flag comprises a most significant bit associated with the first subset after activating the first row of memory cells the first quantity of times.

16. The method of claim 7, further comprising:
transmitting the first flag via a global/input (GIO) line of the memory system based at least in part on generating the first flag, wherein configuring the plurality of multiplexers to use the second subset to store the value of the counter and refraining from using the first subset to store the value of the counter is based at least in part on transmitting the first flag.

17. The method of claim 7, further comprising:
activating a fuse coupled with the first row of memory cells and associated with the first subset, wherein configuring the plurality of multiplexers to use the second subset to store the value of the counter and refraining from using the first subset to store the value of the counter is based at least in part on activating the fuse.

18. A memory system, comprising:
one or memory devices; and
processing circuitry coupled with the one or more memory devices and configured to cause the memory system to:
initiate, by the memory system comprising a first row of memory cells that includes a set of memory cells for storing a value of a counter, a first testing operation on a first subset of the set of memory cells, wherein the set of memory cells comprises a second subset and the value of the counter is associated with the first row of memory cells;
activate the first row of memory cells a first quantity of times based at least in part on initiating the first testing operation;
outputting, by circuitry couple with the first row of memory cells that comprises a plurality of multiplexers, at least one bit of the first subset from a first multiplexer of the plurality of multiplexers to a second multiplexer of the plurality of multiplexers based at least in part on activating the first row of memory cells the first quantity of times;
generate a first flag indicating an error condition of the first subset based at least in part on outputting the at least one bit from the first multiplexer to the second multiplexer; and
configure the plurality of multiplexers to use the second subset to store the value of the counter and to refrain from using the first subset to store the value of the counter based at least in part on the first flag.

19. The memory system of claim 18, wherein the processing circuitry is further configured to cause the memory system to:
receive a first test mode signal, wherein the first test mode signal is associated with the first subset; and
select, based at least in part on the first test mode signal, a first input line of the first multiplexer of the plurality of multiplexers, wherein generating the first flag is based at least in part on selecting the first input line of the first multiplexer of the plurality of multiplexers.

20. The meory system of claim 19, wherein, to generate the first flag, the processing circuitry is configured to cause the memory system to:
activate the first row of memory cells a first time;
output, to the first input line of the first multiplexer, a first bit of the first subset based at least in part on activating the first row of memory cells the first time, wherein the first bit represents a least significant bit associated with the first subset;
activate the first row of memory cells a second time; and
output, from the first multiplexer to a first input line of the second multiplexer, the first bit of the first subset based at least in part on activating the first row of memory cells the second time, wherein the first bit represents a next significant bit associated with the first sub set.

* * * * *